(12) United States Patent
Honda

(10) Patent No.: US 7,728,440 B2
(45) Date of Patent: Jun. 1, 2010

(54) WARP-SUPPRESSED SEMICONDUCTOR DEVICE

(75) Inventor: Hirokazu Honda, Kanagawa (JP)

(73) Assignee: NEC Electronics Corporation (JP)

( * ) Notice: Subject to any disclaimer, the term of this patent is extended or adjusted under 35 U.S.C. 154(b) by 340 days.

(21) Appl. No.: 10/763,554

(22) Filed: Jan. 23, 2004

(65) Prior Publication Data

US 2004/0150118 A1    Aug. 5, 2004

(30) Foreign Application Priority Data

Feb. 3, 2003 (JP) ............................. 2003-026485
Dec. 10, 2003 (JP) ............................. 2003-411921

(51) Int. Cl.
*H01L 23/52* (2006.01)
*H01L 23/02* (2006.01)
*H01L 23/10* (2006.01)
*H01L 23/16* (2006.01)
*H01L 23/24* (2006.01)

(52) U.S. Cl. .......... 257/778; 257/E23.14; 257/E23.193; 257/E23.069; 257/E23.102; 257/E23.11; 257/E23.09; 257/E23.107; 257/E21.503; 257/707; 257/782; 257/737; 257/738; 257/787; 257/789; 257/788; 257/704; 257/710; 257/717; 257/720; 257/712; 361/705

(58) Field of Classification Search .......... 257/E23.121, 257/E23.021, E21.503, E23.09, E23.077, 257/E23.098, E23.087, E23.062, E25.012, 257/E23.069, E25.023, E23.133, E23.129, 257/E23.119, 678, 778, 737, 738, 734, 704, 257/723, 796, 712, 713, 783, 706, 697, 782, 257/707, 710, 717, 720, 788, 789, 790, E23.107, 257/E23.14, E23.193, E23.11; 361/689, 361/704, 705

See application file for complete search history.

(56) References Cited

U.S. PATENT DOCUMENTS

| 4,970,575 | A | * | 11/1990 | Soga et al. ................... 257/786 |
| 5,844,320 | A | * | 12/1998 | Ono et al. .................... 257/778 |
| 5,866,953 | A | * | 2/1999 | Akram et al. ................ 257/790 |
| 6,117,352 | A | * | 9/2000 | Weaver et al. ............... 216/105 |
| 6,157,080 | A | * | 12/2000 | Tamaki et al. ............... 257/738 |
| 6,223,429 | B1 | * | 5/2001 | Kaneda et al. ................ 29/832 |
| 6,224,711 | B1 | * | 5/2001 | Carden et al. ............... 156/311 |
| 6,294,831 | B1 | * | 9/2001 | Shishido et al. ............. 257/729 |
| 6,313,521 | B1 | * | 11/2001 | Baba .......................... 257/678 |
| 6,407,334 | B1 | * | 6/2002 | Jimarez et al. .............. 174/557 |
| 6,410,981 | B2 | | 6/2002 | Tao ............................. 257/704 |
| 6,410,988 | B1 | * | 6/2002 | Caletka et al. .............. 257/778 |
| 6,437,436 | B2 | * | 8/2002 | Wang et al. ................. 257/698 |
| 6,448,665 | B1 | * | 9/2002 | Nakazawa et al. .......... 257/789 |
| 6,462,405 | B1 | * | 10/2002 | Lai et al. .................... 257/675 |
| 6,486,562 | B1 | * | 11/2002 | Kato .......................... 257/778 |

(Continued)

FOREIGN PATENT DOCUMENTS

JP    6-61383    3/1994

(Continued)

*Primary Examiner*—Alexander O Williams
(74) *Attorney, Agent, or Firm*—Hayes Soloway P.C.

(57) ABSTRACT

A semiconductor device includes: a semiconductor chip mounted on a mounting substrate; a first resin filling a gap between the chip and the substrate; a frame-shaped stiffener surrounding the chip; a first adhesive for bonding the stiffener to the substrate; a lid for covering the stiffener and an area surrounded by the stiffener; and a second resin filling a space between the stiffener and the chip. A thermal expansion coefficient of the second resin is smaller than that of the first resin. The first resin includes an underfill part filling a gap between the chip and the substrate and a fillet part extended from the chip region.

20 Claims, 22 Drawing Sheets

U.S. PATENT DOCUMENTS

| | | | |
|---|---|---|---|
| 6,518,089 B2 * | 2/2003 | Coyle | 438/106 |
| 6,661,104 B2 * | 12/2003 | Jiang et al. | 257/789 |
| 6,740,959 B2 * | 5/2004 | Alcoe et al. | 257/659 |
| 6,744,132 B2 * | 6/2004 | Alcoe et al. | 257/706 |
| 6,756,685 B2 * | 6/2004 | Tao | 257/778 |
| 6,762,511 B2 * | 7/2004 | Satsu et al. | 257/789 |
| 6,825,556 B2 * | 11/2004 | Joshi et al. | 257/707 |
| 6,869,831 B2 * | 3/2005 | Cowens et al. | 438/127 |
| 6,894,400 B1 * | 5/2005 | Goodelle et al. | 257/795 |
| 6,933,619 B2 * | 8/2005 | Caletka et al. | 257/796 |
| 6,940,162 B2 * | 9/2005 | Eguchi et al. | 257/723 |
| 7,115,444 B2 * | 10/2006 | Yoshimura | 438/122 |
| 7,442,578 B2 * | 10/2008 | Jiang et al. | 438/106 |
| 2001/0017408 A1 * | 8/2001 | Baba | 257/713 |
| 2002/0056906 A1 * | 5/2002 | Kajiwara et al. | 257/697 |
| 2002/0121705 A1 * | 9/2002 | Pu et al. | 257/778 |
| 2002/0140108 A1 * | 10/2002 | Johnson | 257/778 |
| 2003/0030968 A1 * | 2/2003 | Tsao et al. | 361/329 |
| 2003/0053297 A1 * | 3/2003 | Gaynes et al. | 361/719 |
| 2003/0071348 A1 * | 4/2003 | Eguchi et al. | 257/723 |
| 2004/0195701 A1 * | 10/2004 | Attarwala | 257/783 |
| 2005/0029675 A1 * | 2/2005 | Hua | 257/779 |
| 2005/0082650 A1 * | 4/2005 | Kooi et al. | 257/678 |
| 2005/0121757 A1 * | 6/2005 | Gealer | 257/678 |
| 2005/0121775 A1 * | 6/2005 | Fitzgerald et al. | 257/707 |
| 2005/0205984 A1 * | 9/2005 | Chen-Tung et al. | 257/687 |
| 2005/0242422 A1 * | 11/2005 | Klein et al. | 257/686 |

FOREIGN PATENT DOCUMENTS

| | | |
|---|---|---|
| JP | 11-126835 | 11/1999 |
| JP | 2000-106410 | 4/2000 |
| JP | 2000-260820 | 9/2000 |
| JP | 2000-323624 | 11/2000 |
| JP | 2000-349203 | 12/2000 |
| JP | 2001-244362 | 9/2001 |

* cited by examiner

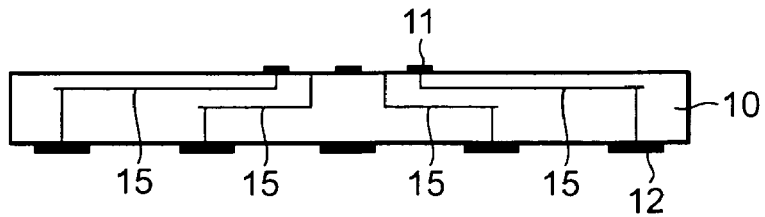
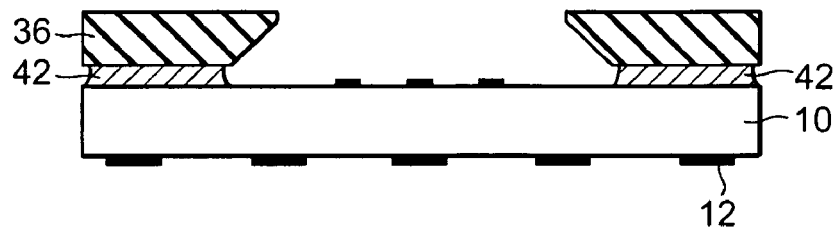
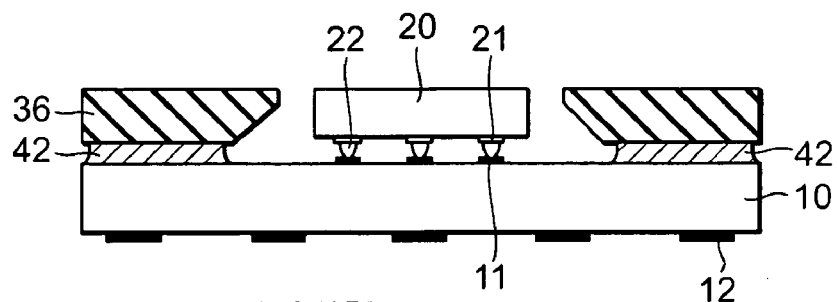
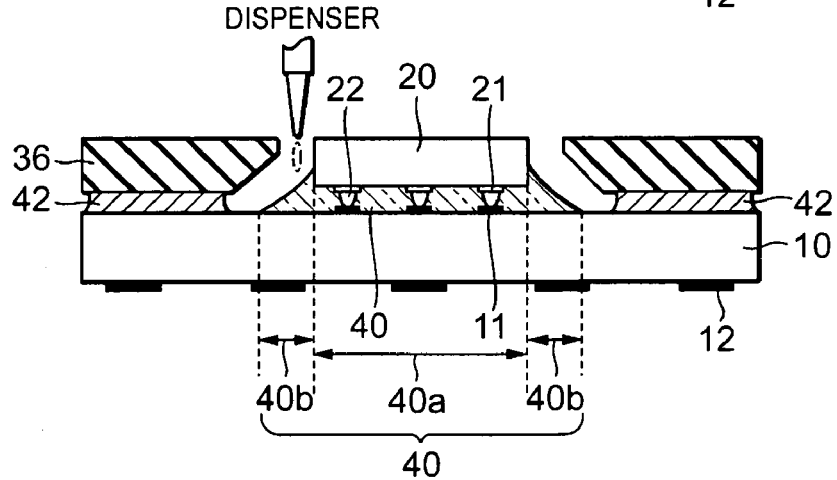
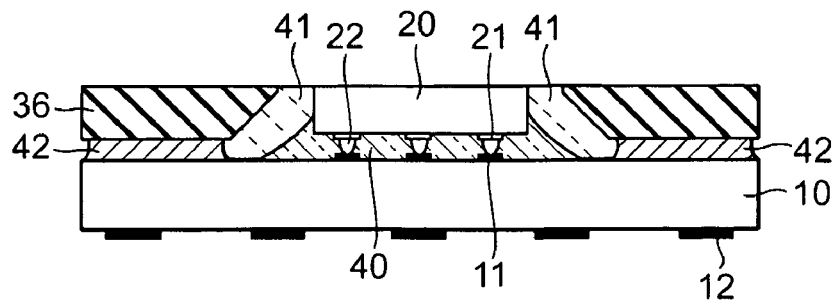

ROOM TEMPERATURE STATE (20°C)

LOW TEMPERATURE STATE (-45°C)

HIGH TEMPERATURE STATE (150°C)

WARP-SUPPRESSED SEMICONDUCTOR DEVICE

BACKGROUND OF THE INVENTION

1. Field of the Invention

This invention relates to a semiconductor device of, e.g., a ball grid array (BGA) type, in which a semiconductor chip is connected, through flip chip bonding, to a mounting substrate manufactured by the same method as that for an organic printed wiring board, and a method for manufacturing the same.

2. Description of the Related Art

Generally, a mounting substrate to which the semiconductor chip is connected through flip chip bonding is manufactured by the same method as that for an organic printed wiring board. The mounting substrate is formed of wiring layers the number of which ranges from two to a dozen or so depending on purposes. However, the thickness of the mounting substrate is about 0.5 to 2.0 m even if there are a dozen wiring layers or so. Accordingly, the mounting substrate is very vulnerable to external force or stress caused by a difference in coefficients of thermal expansion between materials of different kinds and is easily warped. Outside dimensions of the mounting substrate greatly vary depending on a size of a semiconductor chip to be mounted on the mounting substrate, the number of external terminals, and a way of arrangement of the external terminals, e.g., a full grid or a peripheral grid. To take an example, because of lighter weight and thinner formation requirements, the outside dimensions of the mounting substrate are 45 to 50 mmsquare and the thickness thereof is about 1.0 to 2.5 mm in a case where a semiconductor chip is about 17 to 20 mmsquare, the number of pad electrodes of the chip is 2000 to 3000, and the way of arrangement of 1800 to 2000 external terminals (bumps) necessary to be disposed on the mounting substrate is a full grid.

First, a conventional semiconductor device will be described with reference to Japanese Patent Laid-Open Publication No. 2000-323624 and FIGS. 14a and 14b. FIG. 14a is a plan view of a conventional semiconductor device 200, described in, e.g., Japanese Patent Laid-Open Publication No. 2000-323624, in a state in which a lid 231 is removed, and FIG. 14b is a sectional view taken along the line E-E' of FIG. 14a in a state in which the lid 231 is attached. In this semiconductor device 200, a semiconductor chip 220 is connected to amounting substrate 210 with a thickness of about 1 mm through flip chip bonding, and a gap therebetween is filled with an underfill resin 240 to be cured. A stiffener 230 is bonded to the mounting substrate 210 so as to surround the semiconductor chip 220, and the lid 231 is fixed to a backside of the semiconductor chip 220 and to an end surface of the stiffener 230 with a conductive adhesive 243. In addition, a space 247 is formed between the stiffener 230 and side faces of the semiconductor chip 220.

Next, an outline of a method for manufacturing the conventional semiconductor device 200 will be described with reference to FIGS. 15a to 15g. First, the above-described mounting substrate 210, the semiconductor chip 220, the stiffener 230, the underfill resin 240, an epoxy resin adhesive 242, the conductive adhesive 243, and the lid 231 are prepared, and a wiring board diagram of FIG. 15a is set on a stage (not shown) of a screen printer or of a dispenser. Next, the epoxy resin adhesive 242 with a thermal expansion coefficient of 16 to 22 ppm is applied to a peripheral portion of the mounting substrate 210 by means of the screen printer or the dispenser. Thereafter, the stiffener 230 is mounted thereon, and the epoxy resin adhesive 242 is cured at a predetermined temperature (around 100 to 160° C.) (FIG. 15b). Subsequently, bump electrodes 222 formed on pads 221 of the semiconductor chip 220 and lands 211 of the mounting semiconductor substrate 210 are aligned with each other by a flip chip mounter (not shown), and then melted to be connected at a temperature of around 250° C. in the case of a low-melting alloy, e.g., Pb-free solder (FIG. 15c).

In other methods, as a method of connecting the pads 221 of the semiconductor chip 220 and the lands 211 of the mounting substrate 210, there is a method in which materials of joined surfaces include Au and Al, and Au and Au, respectively, and the pads 221 and the lands 211 are connected by applying an ultrasonic wave while heating them. In this case, real curing of the epoxy resin adhesive 242 to bond the stiffener 230 to the mounting substrate 210 is carried out in a separate step. Next, in order to secure adhesive strength of the mounting substrate 210 and the semiconductor chip 220, a gap of about several 100 μm therebetween is filled with the underfill resin 240 which has a thermal expansion coefficient of about 32 ppm and flowability, using the dispenser or the like by utilizing capillary. Then, the underfill resin 240 is cured at a temperature of about 100° C. (FIG. 15d).

Next, the conductive adhesive 243 with a thermal expansion coefficient of 16 to 22 ppm is attached onto the end surface of the stiffener 230 and onto the backside of the semiconductor chip 220 by coating or a printing method (FIG. 15e). Subsequently, the lid 231 is aligned with the stiffener 230 and mounted thereon by applying a proper load. Further, in this state, the conductive adhesive 243 is cured at a temperature of about 150 to 170° C. (FIG. 15f). A batch-processing method in an oven or a general method of continuously putting materials into a belt furnace to cure the materials is applicable for the curing method.

Lastly, solder bumps 213 and external terminals, are bonded to the lands 212 of the mounting substrate 210 by a general method (FIG. 15g). In the conventional semiconductor device 200, in a state at a room temperature and immediately after the solder bumps 213 are bonded to the lands 212 of the mounting substrate 210, as shown in FIG. 16a for example, a portion of the mounting substrate 210 opposite the semiconductor chip 220 is pulled to a semiconductor chip 220 side by about 100 μm to form a convex-shape on a chip mounting surface side.

FIG. 16a is a view schematically showing a state of warpage in the mounting substrate 210 when the semiconductor device 200 is at a room temperature of 20° C., and FIGS. 16b and 16c are views schematically showing state of warpage in the mounting substrate 210 when the semiconductor device 200 is at a low temperature of −45° C. and at a high temperature of 150° C., respectively. As shown in FIG. 16a, the conventional semiconductor device 200 is in a state of being convex to the chip side by about 100 μm at the room temperature of 20° C. When the semiconductor device 200 is cooled to −45° C. from this state, the amount of warpage is increased to 180 μm as shown in FIG. 16b. When the temperature is once returned to the room temperature, and then the semiconductor device 200 is heated to 150° C., the amount of warpage is reduced to about 50 μm as shown in FIG. 16c. Accordingly, in the conventional semiconductor device 200, if a temperature cycling between the low temperature state of −45° C. and the high temperature state of 150° C. is repeated several hundred to several thousand times, cracks may occur in the bump electrodes 222 which join the pads 221 of the semiconductor chip 220 to the lands 211 of the mounting substrate 210, and detachment may also occur in joined interfaces.

A reason for the occurrence of cracks in the solder bumps and for the detachment in the joined interfaces between the pads and the lands can be presumed as follows. FIG. 17 is an enlarged schematic view of the vicinity of one of the bump electrodes 222 to explain the reason. Hereinafter, the description will be made with reference to FIG. 17. Stress with an in-plane direction generated by the thermal expansion coefficient difference between the mounting substrate 210 and the semiconductor chip 220 is absorbed with the underfill resin 240 filled into the gap. However, the contraction of the underfill resin 240 brings a state in which the bump electrode 222 is pulled toward the semiconductor chip 220, and at the same time force in a vertical direction to the surface of the semiconductor chip 220 is applied. If the temperature cycling is repeated in this state, the mounting substrate 210 including the semiconductor chip 220 repeatedly moves between a convex shape and in a flat shape, and thus stresses of tension and compression are repeated in the connected portion of the bump electrode 222 with the pad 221 or in the connected portion of the mounting substrate 210 with the land 211. Consequently, it can be presumed that a crack 217 occurs in the bump electrode 222 and detachment 218 occurs in the joined interface, thus leading to destruction.

In the semiconductor device 200 manufactured by the aforementioned method, the pads 221 of the semiconductor chip 220 with a thickness of 0.7 mm are connected to the wiring electrodes 211 of the resin mounting substrate 210 with a thickness of 0.5 to 2.0 mm through the bump electrodes 222, and secured by the underfill resin 240 for reinforcing the connected portions. In addition, the stiffener 230 with a thickness of about 0.5 to 1.0 mm is bonded to the resin mounting substrate 210 so as to surround the semiconductor chip 220, thereby increasing the flatness and the strength of the resin mounting substrate 210. In this state, the lid 243 with a thickness of 0.5 to 1.0 mm for protecting the semiconductor chip 220 is mounted, thus configuring the semiconductor device 200.

The warpage in the substrate as shown in FIG. 16a occurs in the mounting substrate 210 of the semiconductor device 200 constituted of the aforementioned components at the room temperature. This view is a sectional view taken along the line E-E' of FIG. 14a. A portion directly facing the semiconductor chip 220 is pulled toward the semiconductor chip 220 by the contraction of the underfill resin 240 to be in a convex state on the chip mounting surface side. A portion directly bonded to the stiffener 230 is also deformed to be slightly convex on the chip mounting surface side. In other words, deformation of two-stage shapes occurs.

If the thermal expansion coefficient of the underfill resin 240 is reduced to about 16 to 22 ppm, the phenomenon that the portion directly facing the semiconductor chip 220 is pulled to be convex may be suppressed to a certain extent. However, it is difficult to greatly reduce the amount of warpage in the mounting substrate. To reduce the thermal expansion coefficient of the underfill resin 240, a large amount of silica filler or the like is generally mixed. However, this causes an increase in the viscosity of the resin. Consequently, voids are generated in the underfill resin 240 in a region where the mounting substrate 210 and the semiconductor chip 220 face each other, and thereby the detachment phenomenon easily occurs. Therefore, it was difficult to reduce the thermal expansion coefficient to 32 ppm or lower. That is, there is a trade-off relation between the thermal expansion coefficient of the underfill resin 240 and the viscosity thereof, in which filler such as silica or alumina only needs to be mixed by a large amount in order to reduce the thermal expansion coefficient, but a larger amount of the mixed filler causes a higher viscosity.

Japanese Patent Laid-Open Publication No. 2000-260820 discloses a semiconductor device configured in such a manner that a semiconductor chip is connected to a wiring pattern surface of a mounting substrate; a first sealant (underfill resin) is injected into a gap therebetween at 60 to 120° C. and then cured at 140 to 170° C.; and thereafter side faces of the chip are sealed by a second sealant (well-known fillet material). In this semiconductor device, the first sealant is present in the gap between the chip and the substrate, and the second sealant is formed in a fillet shape on the side faces of the semiconductor chip.

Furthermore, Japanese Patent Laid-Open Publication No. 2000-349203 discloses a semiconductor device configured in such a manner that a semiconductor chip is connected to an interposer substrate through flip chip bonding; a gap between the interposer substrate and the semiconductor chip, and a corresponding portion to the aforementioned stiffener are integrally filled with resin by transfer molding; and a heat spreader (equivalent to the lid) is mounted thereon.

It has now been discovered that, in the conventional semiconductor device, in order to prevent the destruction of the bumps for solder-connecting the materials different in coefficients of thermal expansion, such as the mounting substrate made of an organic resin substrate and the semiconductor chip including, e.g., silicon, a gap between the semiconductor chip and the mounting substrate is filled with the underfill resin with a high thermal expansion coefficient and with a high elastic modulus, thereby reducing stress caused by the difference in thermal expansion coefficients therebetween. However, because of great differences in thermal expansion coefficient and elastic modulus between the materials, at the end of the manufacturing process, the region where the mounting substrate and the semiconductor chip face each other through the underfill resin is in a warped state due to the occurrence of stress to be pulled to the semiconductor chip side. Accordingly, an increased amount of warpage causes a problem that a solder connection failure easily occurs in a warped portion when the semiconductor device is mounted on a circuit board or the like by soldering. Additionally, as for the semiconductor device itself, there is no problem in a state of a room temperature with small fluctuation in a range of about 5° C. to 35° C. However, if a low temperature and a high temperature is repeated like the temperature cycling, there is a problem that the warpage in the mounting substrate causes cracks in the solder bumps for connecting the pads of the semiconductor chip to the lands of the mounting substrate, and detachment in the joined interfaces.

Furthermore, for example, even in the structure in which the first sealant is present in the gap between the chip and the substrate, and the second sealant is formed in a fillet shape on the side faces, it is impossible to completely prevent the contraction of the first sealant and the substrate directly facing the chip. Further, in the case of the structure in which the sealing resin with a large filler content is injected as the underfill resin to fill a gap between the interposer substrate and the semiconductor chip by transfer molding, because of the high viscosity of the resin, voids are easily generated in the gap between the interposer substrate and the semiconductor chip, thereby causing problems leading to loss of reliability, such as the occurrence of cracks and detachment.

SUMMARY OF THE INVENTION

An object of the present invention is to provide a semiconductor device including a semiconductor chip mounted on a mounting substrate through flip chip bonding, in which, in a state after sealing, the amount of warpage in the mounting substrate is in a range which does not hinder solder-mounting of the semiconductor device on a mounting board such as a circuit board; in a temperature cycling test, no destruction is caused by the occurrence of cracks, detachment and the like in solder bumps and the like which are connecting members between the semiconductor chip and the mounting substrate; and no cracks and the like occur in the mounting substrate.

In order to achieve the above object, a semiconductor device of the present invention includes: a semiconductor chip mounted on a mounting substrate with a gap between the chip and the mounting substrate; a first resin filling the gap between the semiconductor chip and the mounting substrate; a stiffener surrounding the semiconductor chip; and a second resin filling a space between the semiconductor chip and the stiffener in contact with the first resin, the first resin being different in a thermal expansion coefficient from the second resin. More specifically, the semiconductor device includes the semiconductor chip provided with a plurality of external connection electrodes (hereinafter, referred to as chip electrodes) on one main surface, and the mounting substrate provided with electrodes (hereinafter, referred to as internal land electrodes) corresponding to the chip electrodes on a first surface. The semiconductor chip is mounted on the mounting substrate by connecting the chip electrodes and the corresponding internal land electrodes through conductive electrodes such as solder bumps (hereinafter, referred to as connection member) while allowing the chip electrodes and the internal land electrodes to face each other. Further, the semiconductor device includes the first resin filling the gap between the semiconductor chip and the mounting substrate, the stiffener surrounding the semiconductor chip, and the second resin filling the space between the semiconductor chip and the stiffener in contact with the first resin, and the first resin is different in the thermal expansion coefficient from the second resin. Note that, the first resin may include an underfill part filling the gap between the semiconductor chip and the mounting substrate, and the fillet part extended from the semiconductor chip region. The thermal expansion coefficient of the second resin may be preferably smaller than that of the first resin. The stiffener may be adhered to the mounting substrate with a resin the same as the second resin or a first adhesive being larger in a thermal expansion coefficient than the second resin.

According to the semiconductor device thus configured, by selecting the first resin and the second resin so that a thermal expansion coefficient of the second resin is smaller than that of the first resin, it is possible to relax the contraction/expansion stress of the first resin caused by temperature changes during and after heat curing. Accordingly, warpage in the mounting substrate can be suppressed even if a material with low viscosity but with a slightly high thermal expansion coefficient is used for the first resin in order to prevent the occurrence of voids in the underfill part and to suppress detachment and destruction of the connection members. Moreover, even in a temperature cycling test in which a low temperature state and a high temperature state are repeated by turns, stress caused by the contraction/expansion of the first resin is limited to a minimum. Thus, it is possible to prevent the occurrence of cracks, detachment and destruction in the connection members such as solder bumps, and detachment of the chip electrodes and the internal land electrodes. More preferably, the thermal expansion coefficient of the second resin is smaller than that of the mounting substrate.

A method for manufacturing a semiconductor device of the present invention includes the steps of: bonding a stiffener to a mounting substrate; connecting a semiconductor chip to the mounting substrate; filling a gap with a first resin and curing it; filling a space between the semiconductor chip and the stiffener with a second resin and curing it; attaching a lid; and connecting solder bumps. In this method, at least the step of bonding the stiffener to the mounting substrate is set as a first step, and the step of connecting the semiconductor chip to the mounting substrate is set as a second step. In this case, preferably, the resin curing in the steps of bonding the stiffener to the mounting substrate, of connecting the semiconductor chip to the mounting substrate, of filling a gap with the first resin and curing it, and of filling a space with the second resin and curing it, is a process of semi-curing the resins, and all the resins are completely cured simultaneously in a process of curing in the step of attaching the lid.

According to this manufacturing method, since the strength of the mounting substrate can be reinforced, it is possible to improve handling performance during the manufacturing processes and to suppress warpage in the mounting substrate. Moreover, since the adhesives and the resins are temporarily cured in the respective steps to become in a semi-cured state, and subjected to real curing at the end to be completely cured, it is possible to suppress warpage in the mounting substrate after the manufacture to a minimum.

Further, another method for manufacturing a semiconductor device of the present invention includes the steps of: bonding a stiffener to a mounting substrate; connecting a semiconductor chip to the mounting substrate; filling a gap with a first resin and curing it; attaching a lid; filling a space, which is surrounded by the lid, side faces of the semiconductor chip, the stiffener and the mounting substrate, with a second resin and curing it; and connecting solder bumps. In this method, the step of filling the space with the second resin and curing it is executed after the step of attaching the lid.

According to this manufacturing method, since the second resin is injected and cured after the lid is attached, the space can be completely filled with the second resin without generating any empty space in the vicinity of the lid, and thus deformation of the mounting substrate can be suppressed.

BRIEF DESCRIPTION OF THE DRAWINGS

The above and other objects, advantages and features of the present invention will be more apparent from the following description taken in conjunction with the accompanying drawings, in which:

FIGS. 9a to 9i are views for explaining a method for manufacturing the semiconductor device of the fifth embodiment, wherein FIGS. 9a to 9f are sectional views for respective steps, taken along the line A2-A2' of FIG. 5a, FIG. 9g is sectional view taken along the line C-C' of FIG. 5a, FIG. 9h is a plan view for a heating pressing-in nozzle brought into contact with two of the groove parts formed in the corners of the stiffener to which the lid is connected, and FIG. 9i is a sectional view taken along the line D-D' of FIG. 9h;

FIGS. 11a to 11g are sectional views for respective steps, taken along the line A1-A1' of FIG. 1a, for explaining a method for manufacturing the semiconductor device of the seventh embodiment;

DETAILED DESCRIPTION OF THE PREFERRED EMBODIMENTS

The invention will be now described herein with reference to illustrative embodiments. Those skilled in the art will recognize that many alternative embodiments can be accomplished using the teaching of the present invention and that the invention is not limited to the embodiments illustrated for explanatory purposes.

First Embodiment

Figure 1A:
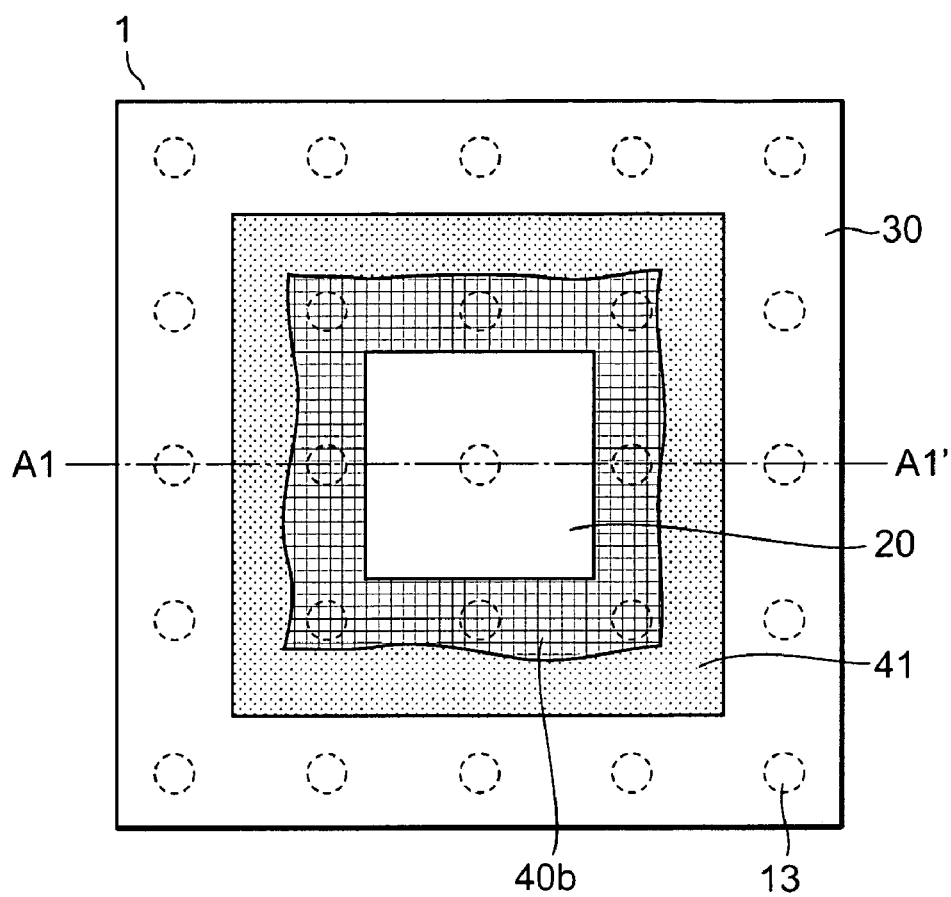
FIG. 1a is a plan view of a semiconductor device of a first embodiment of the present invention, in a state in which a lid is removed.
Figure 1B:
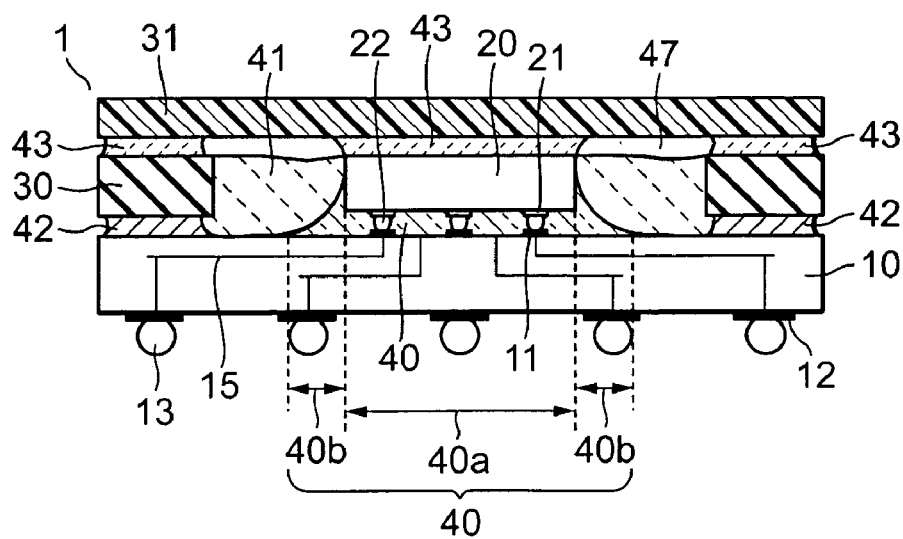
FIG. 1b is a sectional view taken along the line A1-A1' of FIG. 1a, in a state in which the lid is attached to the semiconductor device of the first embodiment.

As shown in FIGS. 1a and 1b, a semiconductor device 1 of a first embodiment includes: a mounting substrate 10; a semiconductor chip 20 mounted on a first surface of the substrate 10 through flip chip bonding; a first resin 40 filling a gap between the substrate 10 and the chip 20; a frame-shaped stiffener 30 surrounding the chip 20; a first adhesive 42 for bonding a first end surface of the stiffener 30 to the substrate 10; a lid 31 for covering the stiffener 30 and an area surrounded by the stiffener 30; a second adhesive 43 for bonding the lid 31 to a backside of the chip 20 and to a second end surface opposite the first end surface of the stiffener 30; and a second resin 41 filling a space between the stiffener 30 and the chip 20 in contact with the first resin 40. The first resin 40 includes an underfill part 40a filling a gap between the chip 20 and the substrate 10, and a fillet part 40b extended from a region where the chip 20 and the substrate 10 face each other. Detailed description will be made below.

The chip 20 includes a plurality of chip electrodes 21 for external connection on a main surface thereof. The substrate 10 includes internal land electrodes 11 formed in corresponding positions to the chip electrodes 21 on the first surface, external land electrodes 12 formed on a second surface opposite the first surface, an in-substrate wiring 15 for connecting the corresponding internal and external electrodes 11 and 12 to each other, and, e.g., solder bumps 13 bonded to the external land electrodes 12. The solder bumps 13 serve as external terminals of the semiconductor device 1.

The internal land electrodes 11 of the substrate 10 and the corresponding chip electrodes 21 of the chip 20 are connected to each other through bump electrodes 22 made of conductive material. The underfill part 40a fills a gap between the chip 20 and the substrate 10 and relaxes stress on the connected portions.

The chip 20 is mounted on a center portion of the substrate 10. The stiffener 30 is bonded to a peripheral portion of the first surface of the substrate 10 with the first adhesive 42 so as to surround the chip 20. In the semiconductor device 1, the stiffener 30 reduces the warpage in the substrate 10 caused by thermal or mechanical stress during manufacturing processes, and at the same time reinforces the strength of the semiconductor device 1.

The second resin 41 fills the space surrounded by the substrate 10, the inner walls of the stiffener 30, the side walls (or faces) of the chip 20 and the lid 31 in contact with the fillet part 40b, and all the space is almost eliminated. The thermal expansion coefficient of the second resin 41, more specifically, the linear expansion coefficient thereof is smaller than at least that of the first resin 40. According to such a semiconductor device 1, since the space between the chip 20 and the stiffener 30 is filled with the second resin 41 smaller in thermal expansion coefficient than at least the first resin 40 and the second resin 41 is cured, it is possible to suppress warpage in the substrate 10 due to the expansion/contraction of the first resin 40 at the high/low temperature states. Note that the warpage in the substrate 10 can be further reduced by setting the thermal expansion coefficient of the second resin 41 smaller than those of the first adhesive 42, the second adhesive 43, the substrate 10, and the like.

Here, Table 1 shows examples of characteristics of the used resins such as the first resin 40, the second resin 41 and the like.

TABLE 1

Characteristics of each resin

|  | Thermal expansion coefficient (ppm) | Elastic modulus (GPa) |
|---|---|---|
| First adhesive | 16-22 | 11-12 |
| First resin | 30-32 | 9-10 |
| Second resin | 8-16 | 11-28 |
| Second adhesive | 50-100 | 3-9 |

Figure 8A:
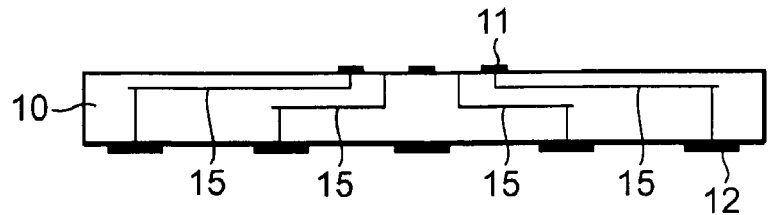
FIGS. 8a to 8h are sectional views for respective steps, taken along the line A1-A1' of FIG. 1a, for explaining a method for manufacturing the semiconductor device of the first embodiment.

Next, referring to FIGS. 8a to 8h, a method for manufacturing the semiconductor device 1 of the first embodiment will be described in the order of steps. First, the mounting substrate 10 is prepared. On the first surface of the substrate 10, the internal land electrodes 11, which are formed in corresponding positions to the chip electrodes 21 of the chip 20 to be mounted, and the external land electrodes 12, which are formed on the second surface opposite the first surface, are provided. The corresponding internal and external land electrodes 11 and 12 are connected to each other through the in-substrate wiring 15 (FIG. 8a).

Figure 8B:
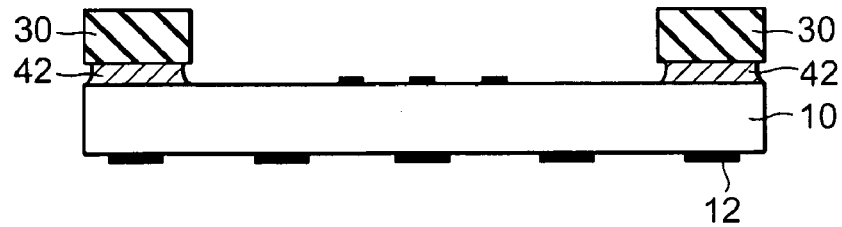

Second, the first adhesive 42 with a thermal expansion coefficient of 16 to 22 ppm and with an elastic modulus of 11 to 12 GPa is applied to the peripheral portion of the substrate 10 in a shape so as to coincide with the shape of the frame-shaped stiffener 30, which is also prepared beforehand. Thereafter, the stiffener 30 is aligned with the portion coated with the first adhesive 42 and mounted thereon so that the first end surface is brought into contact with the first adhesive 42, which is then temporarily cured at around 125° C. for about 15 minutes (FIG. 8b). In this state, the stiffener 30 is bonded to the mounting substrate 10, but the first adhesive 42 has not completely set yet. Note that the first adhesive 42 essentially contains a resin material selected from the group consisting of, e.g., epoxy, polyolefin, silicon, cyanate ester, polyimide, and polynorbornene resins, and is adjusted by mixing a proper amount of an inorganic filler so as to set the thermal expansion coefficient and the elastic modulus to desired values. A material of the stiffener 30 can be selected from the group consisting of Cu, SUS (ferrite stainless steel), alumina, silicon, aluminum nitride, and epoxy resin.

Figure 8C:
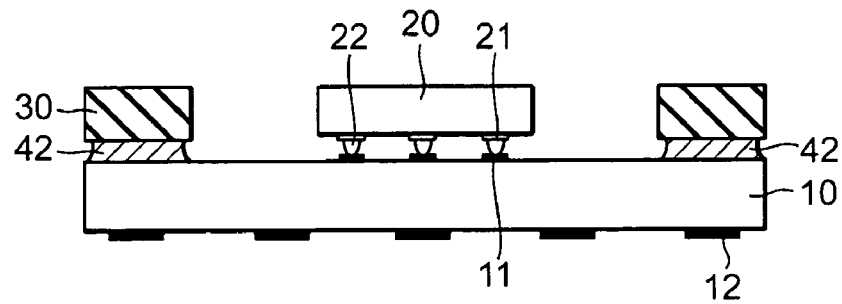

Third, the chip 20 is connected to the substrate through flip chip bonding. More specifically, the chip 20 in which the bump electrodes 22 are bonded onto the chip electrodes 21 is positioned and mounted on the internal land electrodes 11 so that the bump electrodes 22 are brought into contact with the corresponding internal land electrodes 11, and heated to around 250° C. in, e.g., a nitrogen atmosphere, to be connected to the internal land electrodes 11 of the substrate 10 (FIG. 8c).

Figure 8D:
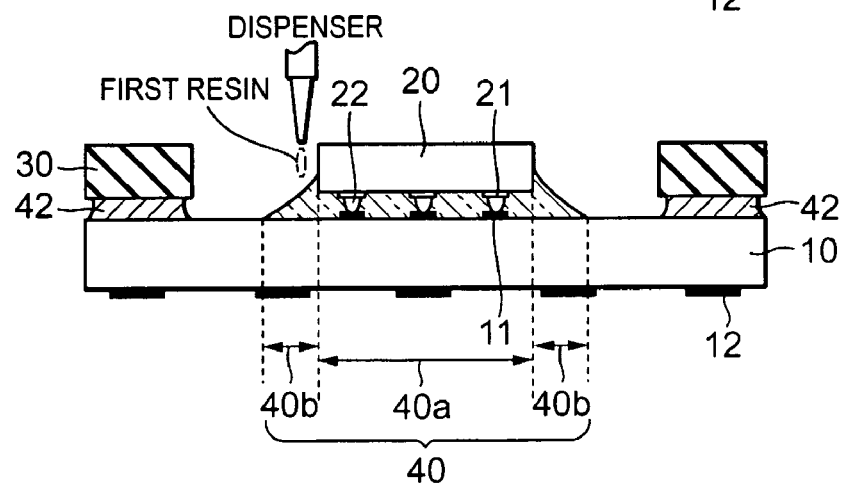

Next, the first resin 40 is injected into a gap between the chip 20 and the substrate 10 with a dispenser or the like by a dropping method and fills the gap. Thereafter, the first resin 40 is temporarily cured at around 100° C. for about 10 minutes (FIG. 8d). In this state, the first resin 40 also has not completely set yet. The first resin 40 is prepared by adjusting, e.g., an epoxy resin so that the thermal expansion coefficient thereof is set to about 32 ppm and the elastic modulus thereof to about 9 GPa. With these characteristics of the first resin 40, the flowability thereof is 1000 to 40000 centipoises (CPS), and the first resin 40 can be injected to fill the gap between the chip 20 and the substrate 10, so that the underfill part 40a can be formed without generating any voids. At this time, the first resin 40 forms not only the underfill part 40a in the gap between the chip 20 and the substrate 10 but also the fillet part 40b extended from the underfill part 40a to a surrounding area of the chip 20. However, the fillet part 40b does not reach the stiffener 30, and at this point in time, the first surface of the substrate 10 is exposed between the fillet part 40b and the stiffener 30.

Figure 8E:
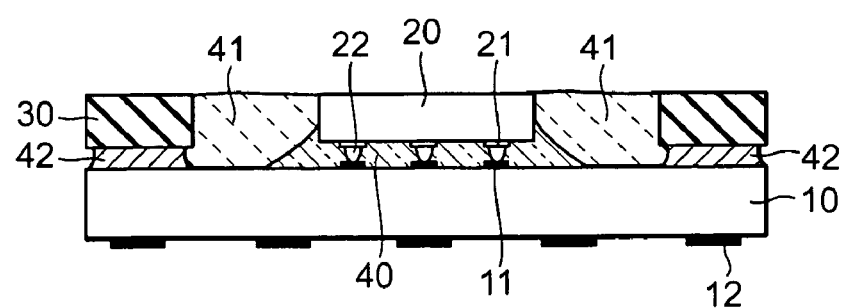

Subsequently, the space surrounded by the inner walls of the stiffener 30, the side walls of the chip 20, the first surface of the substrate 10 and the fillet part 40b is filled with the second resin 41, which is then temporarily cured at around 150° C. for about 30 minutes (FIG. 8e). In this state, the second resin 41 also has not completely set yet. For the second resin 41, an epoxy resin smaller in thermal expansion coefficient than the first resin 40, for example, an epoxy resin with a thermal expansion coefficient of 8 to 16 ppm and with an elastic modulus of 11 to 28 GPa can be used. It is more preferable if the thermal expansion coefficient of the second resin 41 can be set smaller than that of the substrate 10. As a filling method, a method of injection, transfer molding, liquid resin dropping or the like can be used.

Figure 8F:
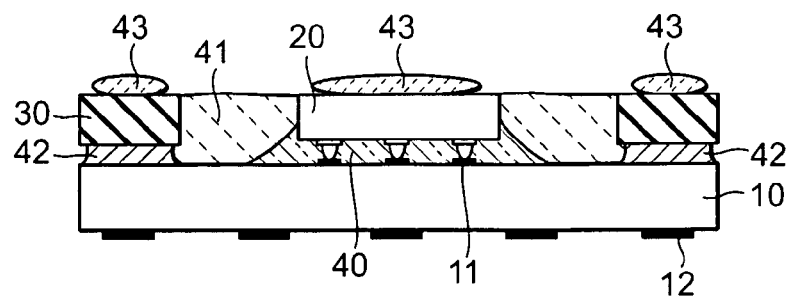
Figure 8G:
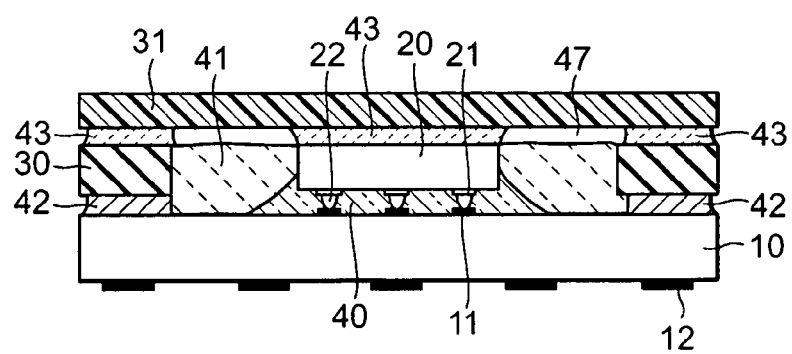

Next, the second adhesive 43 is applied onto the backside of the chip 20 and onto the second end surface of the stiffener 30 (FIG. 8f). Thereafter, the lid 31 is mounted to cover the entire area surrounded by the stiffener 30. A proper load is applied on the lid 31, and the temperature of the entire device is slowly increased to about 175° C. Further maintaining it at about 175° C. for about 60 minutes, real curing is carried out (FIG. 8g). Thus, all of the first resin 40, the second resin 41, the first adhesive 42 and the second adhesive 43 are completely cured, and the lid 31 is completely bonded. Note that, for the second adhesive 43, an epoxy resin with a thermal expansion coefficient of about 50 to 100 ppm can be used, for example. In addition, it is more preferable to mix a proper amount of Ag or Cu powder as inorganic filler into the second adhesive 43 to improve the thermal conductivity of the second adhesive 43.

Figure 8H:
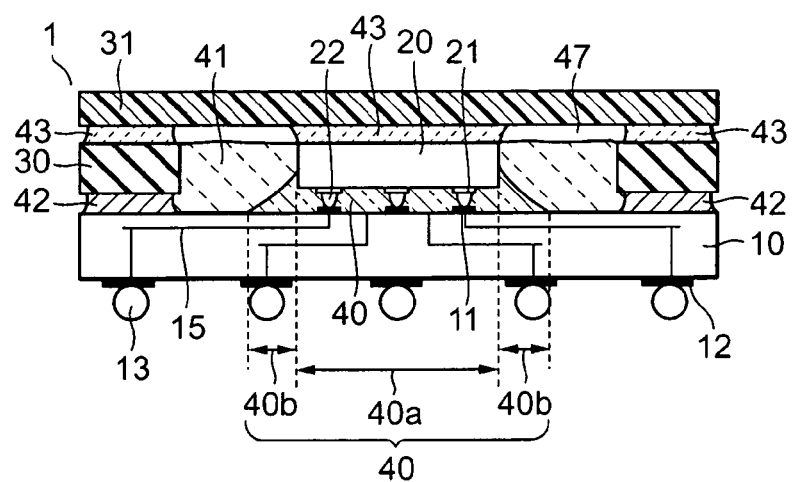

Finally, the solder bumps 13, which are external terminals, are bonded to the external land electrodes 12 of the substrate 10 by a general method, thus completing the semiconductor device 1 (FIG. 8h).

Note that, for all of the main component resin materials of the first resin 40, of the second resin 41, of the first adhesive 42 and of the second adhesive 43, the same epoxy resin, for example, can be used. The resin may be adjusted to optimal characteristics in accordance with required characteristics thereof, such as a thermal expansion coefficient, by changing an inorganic filler content added to the main component resin.

Second Embodiment

Figure 2:
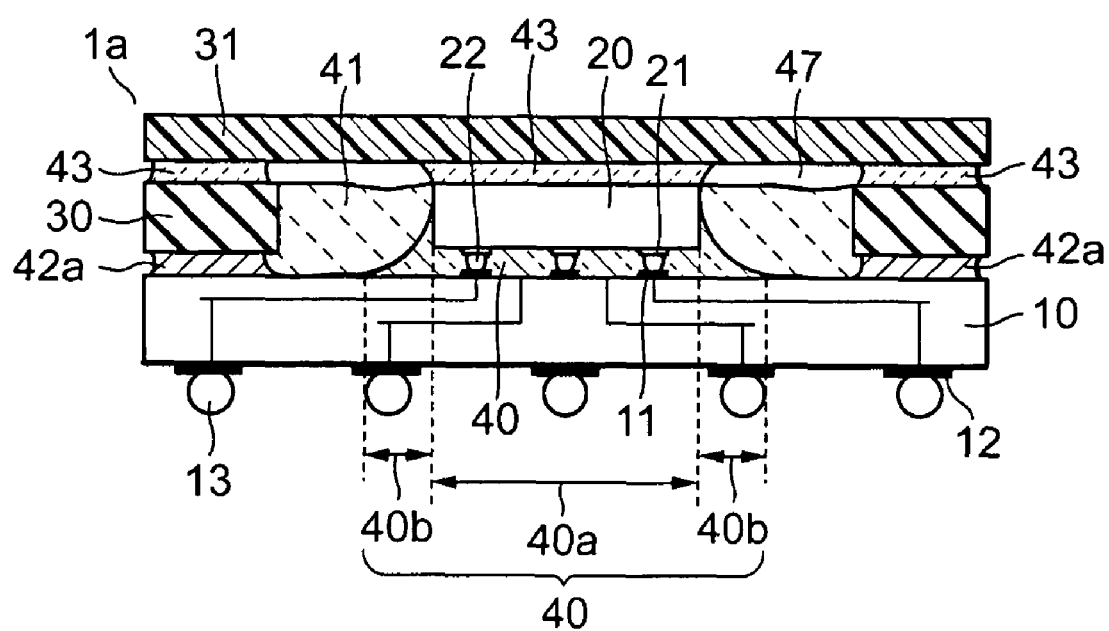
FIG. 2 is a sectional view of a semiconductor device of a second embodiment of the present invention, equivalent to FIG. 1b of the first embodiment.

Next, a second embodiment will be described with reference to FIG. 2. Note that a method for manufacturing a semiconductor device 1a of the second embodiment is similar to that for the semiconductor device 1 of the first embodiment. A configuration of the semiconductor device 1a is almost the same as that of the semiconductor device 1. The difference between the semiconductor device 1a and the semiconductor device 1 is that a resin the same as the second resin 41 is used as a first adhesive 42a for bonding the stiffener 30 to the substrate 10. According to this semiconductor device 1a, by using the resin the same as the second resin 41 with a thermal expansion coefficient of about 8 to 16 ppm and with an elastic modulus of 11 to 28 GPa for the first adhesive 42a for bonding the stiffener 30, the contraction in a portion of the substrate 10 directly facing the chip 20 can be reduced more, and thus it is possible to suppress the warpage in the substrate 10.

Third Embodiment

Figure 3A:
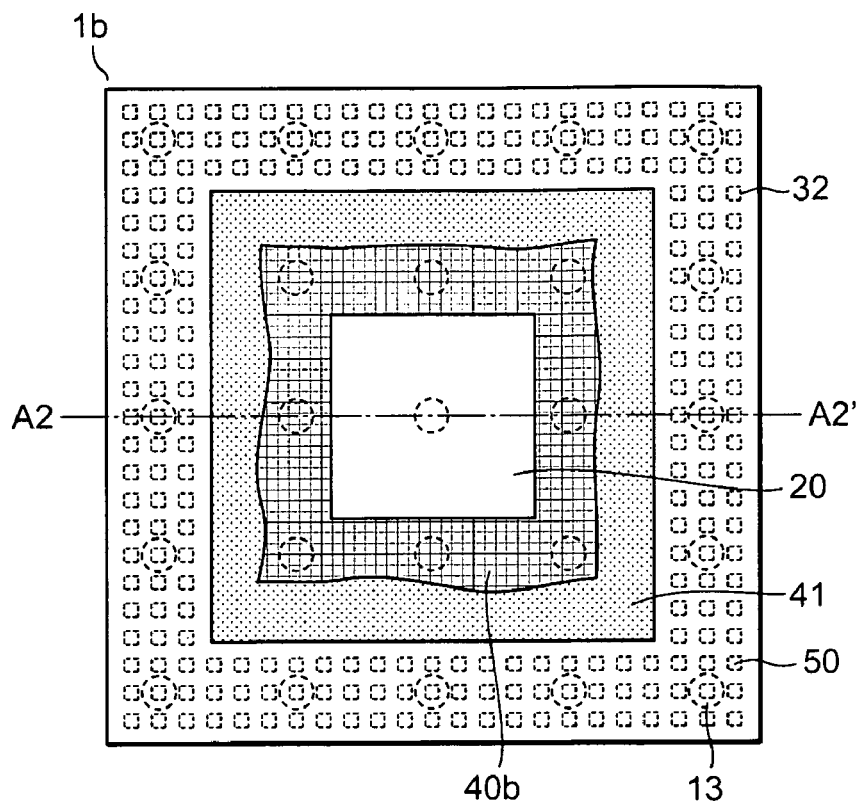
FIG. 3a is a plan view of a semiconductor device of a third embodiment of the present invention, in a state in which a lid is removed.
Figure 3B:
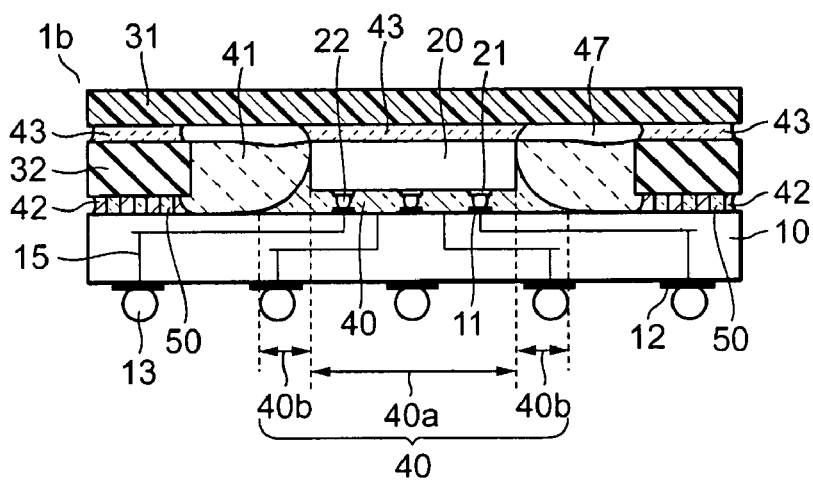
FIG. 3b is a sectional view taken along the line A2-A2' of FIG. 3a, in a state in which the lid is attached to the semiconductor device of the third embodiment.
Figure 3C:
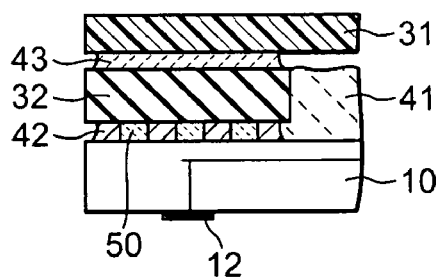
FIG. 3c is a partially enlarged sectional view of a bonded portion of a mounting substrate with a stiffener in FIG. 3b.

Next, a third embodiment will be described with reference to FIGS. 3a to 3c. Referring to FIGS. 3a to 3c, a semiconductor device 1b of the third embodiment includes: a mounting substrate 10; a semiconductor chip 20 mounted on a first surface of the substrate 10 through flip chip bonding; a first resin 40 filling a gap between the substrate 10 and the chip 20; a frame-shaped stiffener 32 surrounding the chip 20; a first adhesive 42 for bonding a first end surface of the stiffener 32 to the substrate 10; a lid 31 for covering the stiffener 32 and an area surrounded by the stiffener 32; a second adhesive 43 for bonding the lid 31 to a backside of the chip 20 and to a second end surface opposite the first end surface of the stiffener 32; and a second resin 41 filling a space surrounded by the stiffener 32, side faces of the chip 20 and the substrate 10 in contact with the first resin 40. The first resin 40 includes an underfill part 40a filling a gap between the chip 20 and the substrate 10, and a fillet part 40b extended from a region where the chip 20 and the substrate 10 face each other. A configuration of the semiconductor device 1b of the third embodiment is almost the same as that of the semiconductor device 1. The difference between the semiconductor device 1b and the semiconductor device 1 is that ruggedness is present in a gap between the first end surface of the stiffener 32 and the substrate 10. Specifically, the entire first end surface of the stiffener 30 of the semiconductor device 1 is planar, while the first end surface of the stiffener 32 is processed, e.g., in a spiral or a grid shape of grooves, or in a shape in which convex parts 50 and concave parts are alternately formed. In this case, a depth of the grooves or of the concave parts can be set as occasion demands, but preferably set to about 50 to 200 μm which is approximately the same as the gap between the chip 20 and the substrate 10. A material of the stiffener 32 can be selected from the group consisting of Cu, SUS (ferrite stainless steel), alumina, silicon, aluminum nitride, and epoxy resin. The stiffener 32 is bonded to the substrate 10 by filling the concave parts in the first end surface with the first adhesive 42. Note that, in this case as well, the concave parts of the first end surface may be filled with a resin the same as the second resin 41 in place of the first adhesive 42.

An operation feature at room temperature and temperature cycling according to the structure of the semiconductor device 1b, is that the warpage in the substrate 10 by the stiffener 32 is first suppressed by approximating a bonding state between the substrate 10 and the stiffener 32 to that between the chip 20 and the substrate 10. Further, the first resin 40 fills the gap between the chip 20 and the substrate 10 to which the chip is connected, and then the first resin 40 is cured. In addition, the second resin 41 fills the space around the chip 20 so that the second resin 41 occupies the almost entire space, and then the second resin 41 is cured. Up-and-down movements are suppressed by the second resin 41 filling the space between the sidewalls of the chip 20 and the inner walls of the stiffener 32. The stiffener 32 can be made of a material such as silicon or copper, then connection electrodes are disposed in regions of the mounting substrate 10, with which the convex parts 50 of the first end surface are brought into contact, and the convex parts 50 of the first end surface is metalized and activated by use of a flux to be connected to the connection electrodes by solder. In this case, since the bonding state between the substrate 10 and the stiffener 32 can be set similar to that between the chip 20 and the substrate 10, it is possible to suppress warpage in the substrate 10 caused by contraction. Moreover, the example has been described in which the first end surface of the stiffener 32 is in the rugged shape. However, low-melting metal members such as solder bumps, which become gap members, may be arranged in the regions of the mounting substrate 10 brought into contact with the stiffener 32 to form a rugged shape.

Fourth Embodiment

Figure 4:
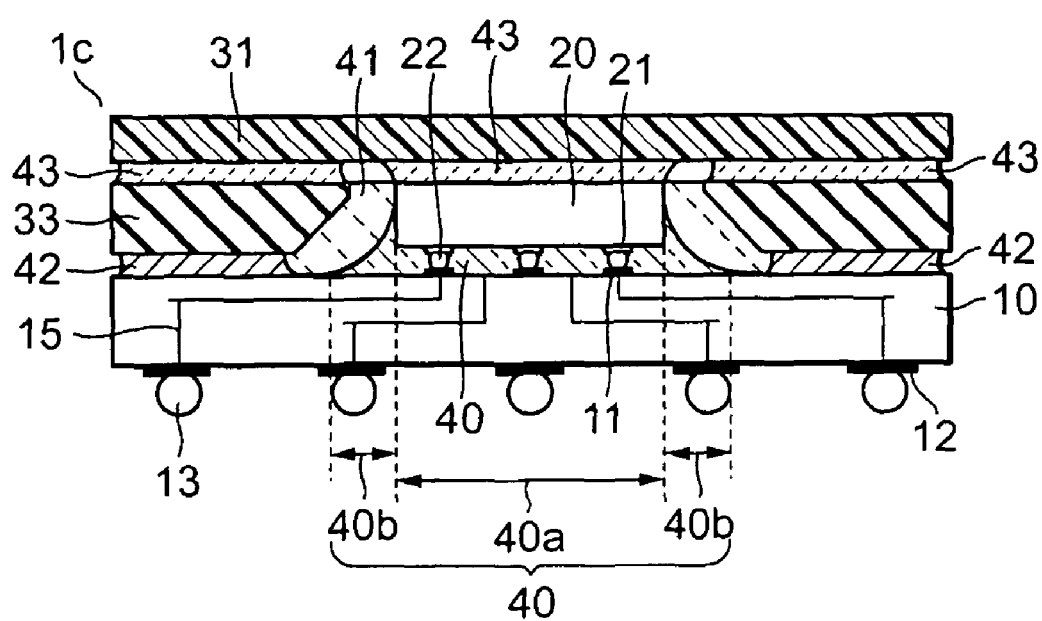
FIG. 4 is a sectional view of a semiconductor device of a fourth embodiment of the present invention, equivalent to FIG. 1b of the first embodiment.

Next, a fourth embodiment will be described with reference to FIG. 4. Referring to FIG. 4, a semiconductor device 1c of the fourth embodiment is different from the semiconductor devices 1, 1a and 1b of the first to third embodiments, respectively, only in that a shape of an opening of a stiffener 33 is reverse-tapered. The other configuration may be similar to those of the semiconductor devices 1, 1a and 1b. In the semiconductor device 1c, since an eave portion of the stiffener 33 is spread over the second resin 41, there is an effect of preventing the deformation of the fillet part 40b and of the second resin 41 toward a lid 31. Note that a method for manufacturing the semiconductor device 1c of the fourth embodiment is similar to that of each semiconductor device of the first to third embodiments, and therefore description thereof will be omitted.

Fifth Embodiment

Figure 5A:
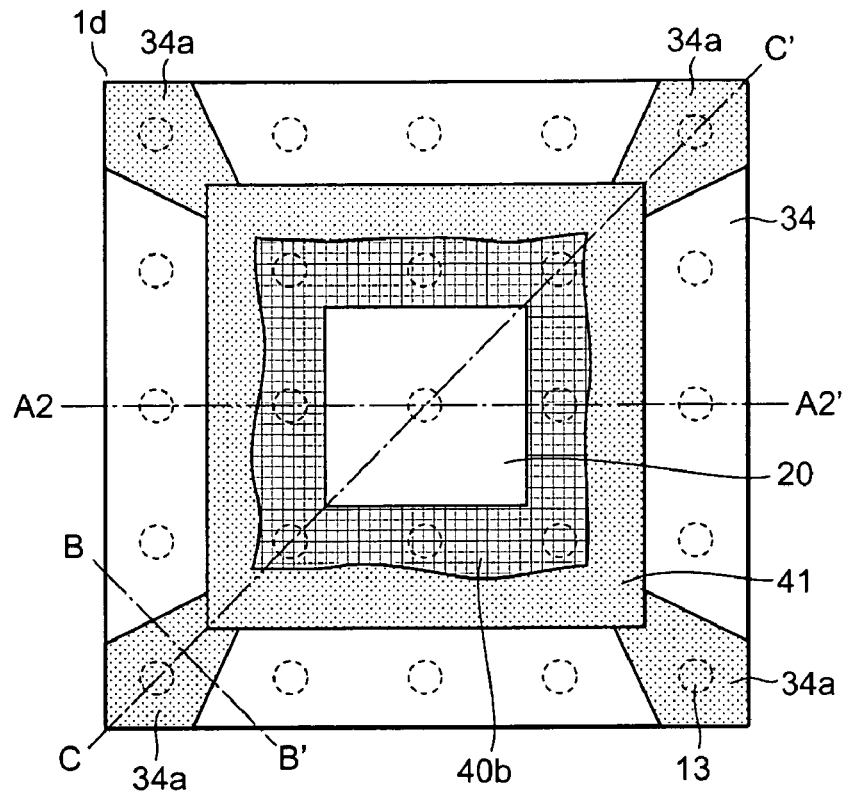
FIG. 5a is a plan view of a semiconductor device of a fifth embodiment of the present invention, in a state in which a lid is removed.
Figure 5B:
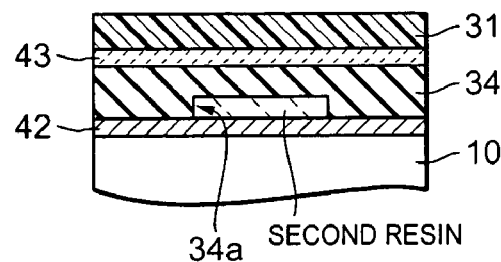
FIG. 5b is a partially sectional view taken along the line B-B' of FIG. 5a, in a state in which the lid is attached to the semiconductor device of the fifth embodiment.
Figure 5C:
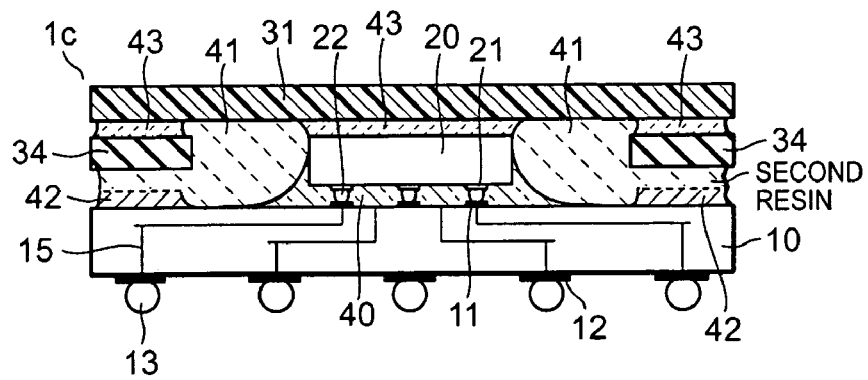
FIG. 5c is a sectional view taken along the line C-C' of FIG. 5a, in a state in which the lid is attached to the semiconductor device of the fifth embodiment.

Next, a fifth embodiment will be described with reference to FIGS. 5a to 5c. Referring to FIGS. 5a to 5c, a semiconductor device 1d of the fifth embodiment includes: amounting substrate 10; a semiconductor chip 20 mounted on a first surface of the substrate 10 through flip chip bonding; a first resin 40 filling a gap between the substrate 10 and the chip 20; a frame-shaped stiffener 34 surrounding the chip 20; a first adhesive 42 for bonding a first end surface of the stiffener 34 to the substrate 10; a lid 31 for covering the stiffener 34 and an area surrounded by the stiffener 34; a second adhesive 43 for bonding the lid 31 to a backside of the chip 20 and to a second end surface opposite the first end surface of the stiffener 34; and a second resin 41 filling a space surrounded by the stiffener 34, side faces of the chip 20 and the substrate 10 in contact with the first resin 40. The first resin 40 includes an underfill part 40a filling a gap between the chip 20 and the substrate 10, and a fillet part 40b extended from a region where the chip 20 and the substrate 10 face each other. A configuration of the semiconductor device 1d of the fifth embodiment is almost the same as that of the semiconductor device 1. The difference is that a concave part 34a is formed on a first end surface side in each of four corners of the stiffener 34, and these concave parts 34a are filled with the second resin 41. A rectangular semiconductor device is easily influenced by expansion/contraction in the diagonal direction thereof, because a diagonal length thereof is longest therein. According to the semiconductor device 1d, the aforementioned structure provides an effect of suppressing an influence by expansion/compression.

In the semiconductor device 1d of this embodiment, as a material of the stiffener 34, it is preferable to use a material of which the thermal expansion coefficient is approximate to that of the substrate 10, such as Al, Cu or SUS. The first adhesive 42 may be used for bonding the substrate 10 to the other parts than the concave parts 34a of the stiffener 34, i.e., to side centers of the stiffener 34, but the use of a resin the same as the second resin 41 is more preferable. The concave parts 34a provided in the corners are filled with the second resin 41. A working feature according to the structure of the fifth embodiment is that the thermal expansion coefficients of the substrate 10 and of the stiffener 34 are nearly matched with each other, and at the same time, the concave parts 34a are filled with the second resin 41, thereby suppressing the warpage in the substrate 10. Moreover, the warpage in the portion of the substrate 10 directly facing the chip 20 is suppressed by the first resin 40 and the second resin 41.

Next, a method for manufacturing the semiconductor device 1d of this embodiment will be described. Since a first method for manufacturing the semiconductor device 1d is almost similar to that for the semiconductor device 1 of the first embodiment, different points will be mainly described. A first different point is the shape of the first end surface of a stiffener. The stiffener 34 has the concave parts 34a processed on the first end surface in each corner. On the contrary, the first end surface of the stiffener 30 is flat. A second different point is that, in association with the use of the stiffener 34, the first adhesive 42 or the second resin 41 is applied on the substrate 10 in a shape so as to coincide with the shape of the stiffener 34, the second resin 41 is superposedly applied on corresponding positions to the concave parts 34a, and the stiffener 34 is aligned with the portions coated with the first adhesive 42 or the second resin 41 in the shape so as to coincide with the shape of the stiffener 34 and mounted thereon so that the first end surface is brought into contact with the first adhesive 42 or the second resin 41. The other portions can be manufactured by a similar manufacturing method to that for the semiconductor device 1 of the first embodiment.

Figure 9A:
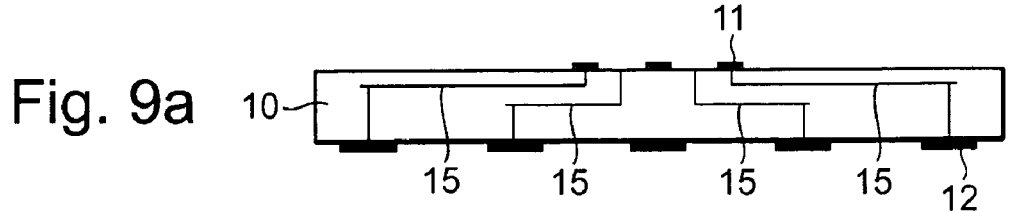

Next, a second method for manufacturing the semiconductor device 1d will be described with reference to FIGS. 9a to 9i. First, the stiffener 34 (not shown in FIG. 9a) and the substrate 10 are prepared. On the first surface of the substrate 10, the internal land electrodes 11 are formed in corresponding positions to the chip electrodes 21 of the chip 20 to be mounted. The external land electrodes 12 are formed on the second surface opposite the first surface. The corresponding internal and external land electrodes 11 and 12 are connected to each other through in-substrate wiring 15 (FIG. 9a).

Figure 9B:
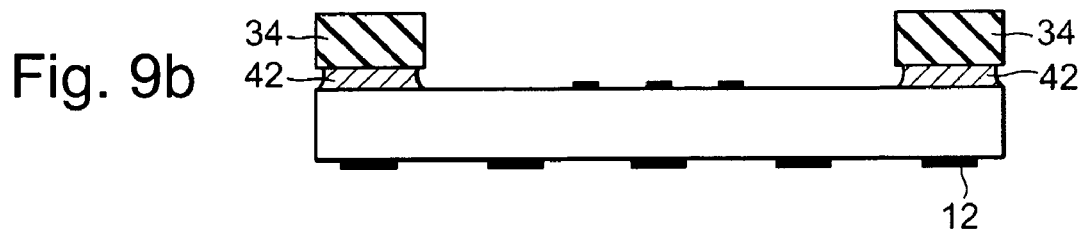

Next, the first adhesive 42 with a thermal expansion coefficient of 16 to 22 ppm and with an elastic modulus of 11 to 12 GPa is applied on a peripheral portion of the substrate 10 in a shape so as to coincide with the shape of the prepared stiffener 34. Thereafter, the stiffener 34 is aligned with the portion coated with the first adhesive 42 and mounted thereon so that the first end surface is brought into contact with the first adhesive 42, which is then temporarily cured at around 125° C. for about 15 minutes (FIG. 9b). In this state, the stiffener 34 is bonded to the substrate 10, but the first adhesive 42 has not completely set yet. Note that the first adhesive 42 essentially contains a resin material selected from the group consisting of, e.g., epoxy, polyolefin, silicone, cyanate ester, polyimide, and polynorbornene resins, and is adjusted by mixing a proper amount of inorganic filler so that the thermal expansion coefficient and the elastic modulus are set to desired values. A material of the stiffener 34 is preferably selected from the group consisting of Cu, SUS (ferrite stainless steel), and Al of which the thermal expansion coefficient is approximate to that of the substrate 10.

Figure 9C:
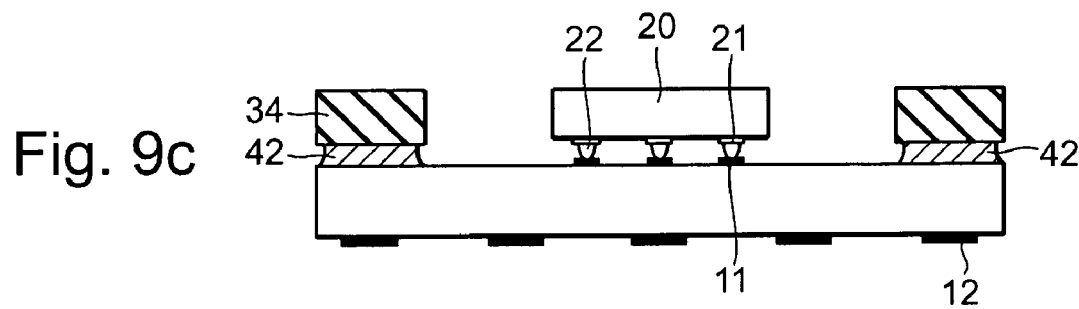

Next, the chip 20 in which the bump electrodes 22 are bonded to the chip electrodes 21 is positioned and mounted so that the bump electrodes 22 are brought into contact with the corresponding internal land electrodes 11, and heated to about 250° C. in, e.g., a nitrogen atmosphere, thus connecting the chip 20 to the internal land electrodes 11 of the substrate 10 (FIG. 9c).

Figure 9D:
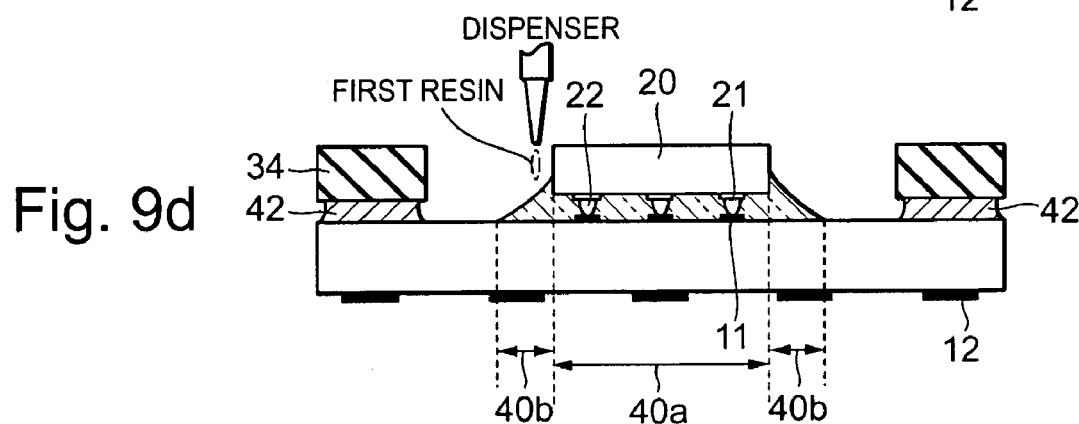
Figure 9E:
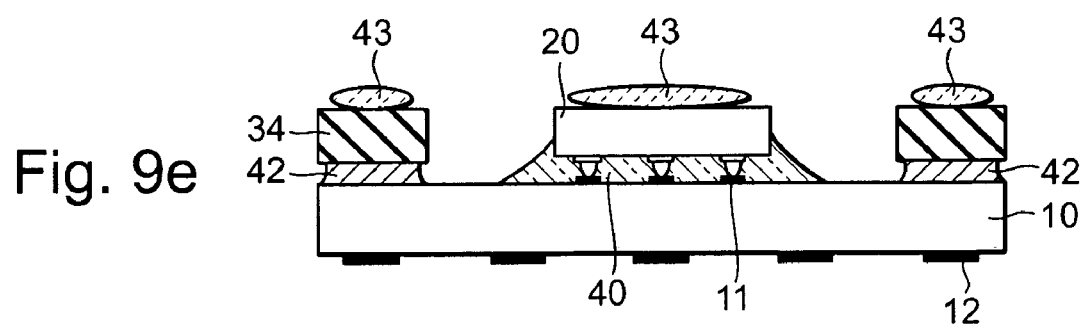

Next, the first resin 40 is injected with a dispenser or the like by a dropping method to fill a gap between the chip 20 and the substrate 10, and then temporarily cured at around 100° C. for about 10 minutes (FIG. 9d). In this state, the first resin 40 also has not completely set yet. Note that the first resin 40 is prepared by adjusting, e.g., epoxy resin to have a thermal expansion coefficient of about 32 ppm and an elastic modulus of about 9 GPa. With these characteristics of the first resin 40, the flowability thereof is 1000 to 40000 centipoises (CPS), and the first resin 40 can be injected to fill the gap between the chip 20 and the substrate 10 without generating any voids and fills that without generating any voids. At this time, the first resin 40 forms not only the underfill part 40a filling the gap between the chip 20 and the substrate 10 but also the fillet part 40b extended from the underfill part 40a to a surrounding area of the chip 20. However, the fillet part 40b does not reach the stiffener 34, and at this point of process steps, the first surface of the substrate 10 is exposed between the fillet part 40b and the stiffener 34.

Figure 9F:
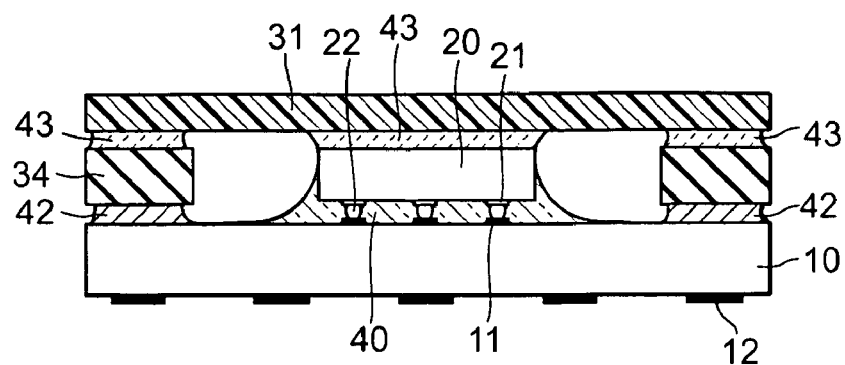
Figure 9G:
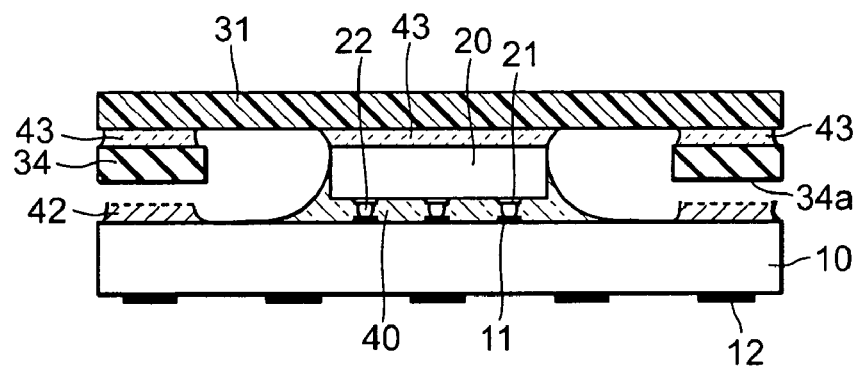

Next, after the second adhesive 43 is applied onto the backside of the chip 20 and onto the second end surface of the stiffener 34 (FIG. 9e), the lid 31 is mounted on the second adhesive 43 so as to cover the entire area surrounded by the stiffener 34. The second adhesive 43 is then heated at about 150° C. for about 30 minutes, and thereby temporarily cured to bond the lid 31 thereto (FIGS. 9f and 9g). Note that, for the second adhesive 43, an epoxy resin with a thermal expansion coefficient of about 50 to 100 ppm can be used, for example. In the case of the second adhesive 43, it is more preferable to mix a proper amount of Ag or Cu powder as an inorganic filler to improve the thermal conductivity of the second adhesive 43.

Figure 9H:
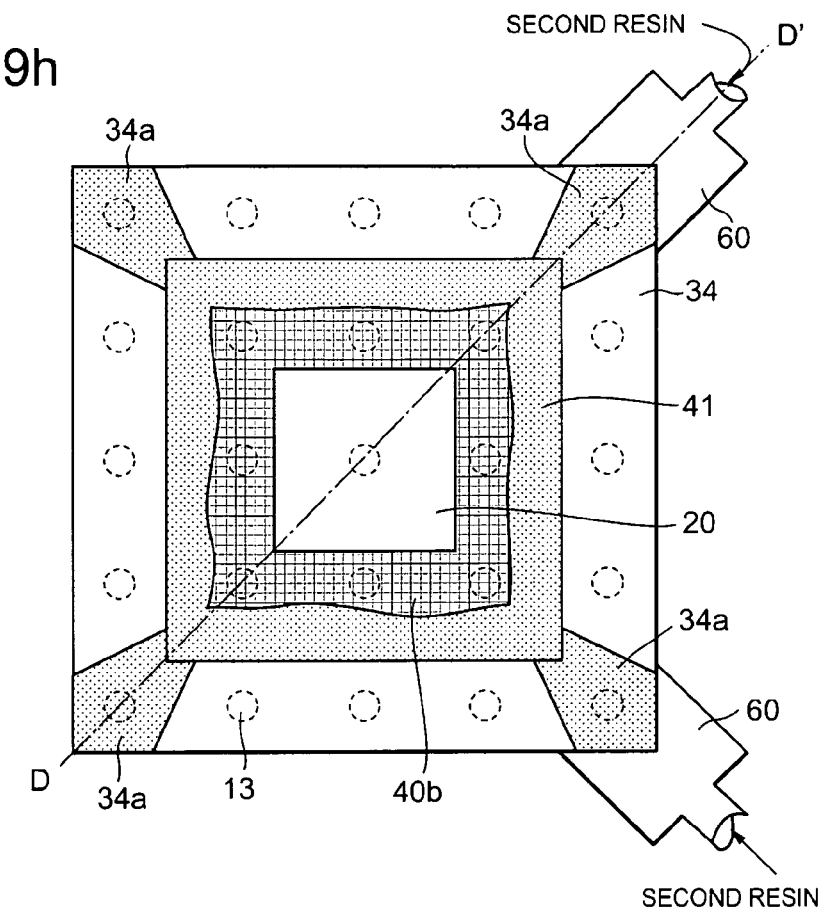
Figure 9I:
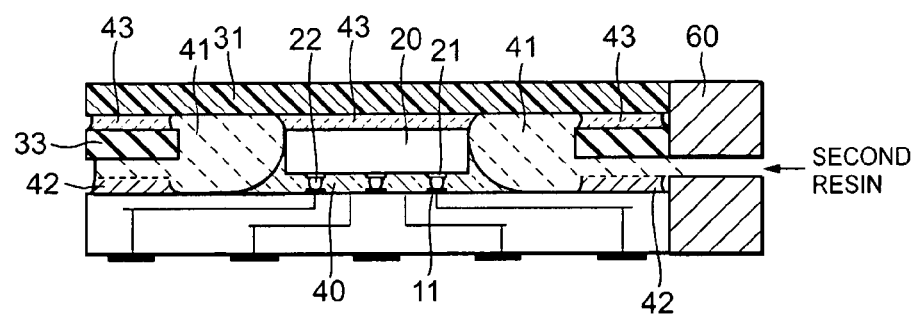
Figure 10A:
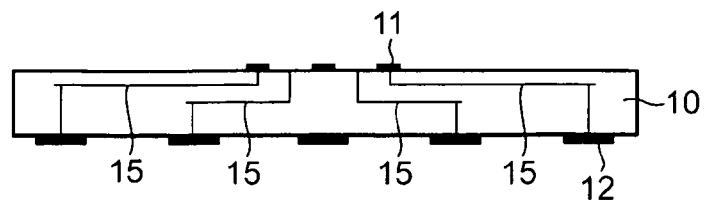
FIGS. 10a to 10g are sectional views for respective steps, taken along the line A1-A1' of FIG. 1a, for explaining a method for manufacturing the semiconductor device of the sixth embodiment.
Figure 10B:
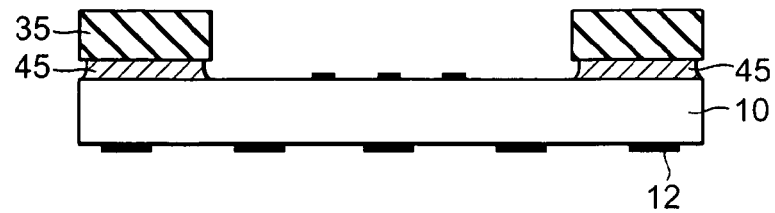
Figure 10C:
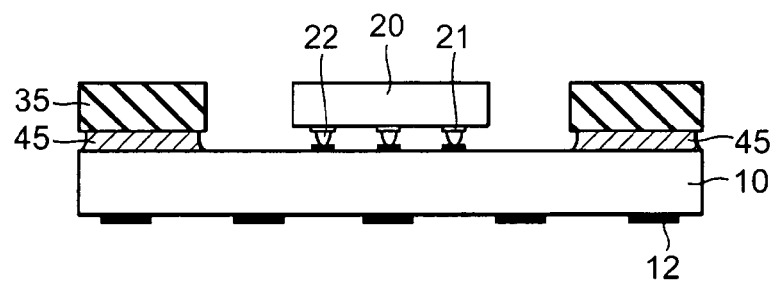
Figure 10D:
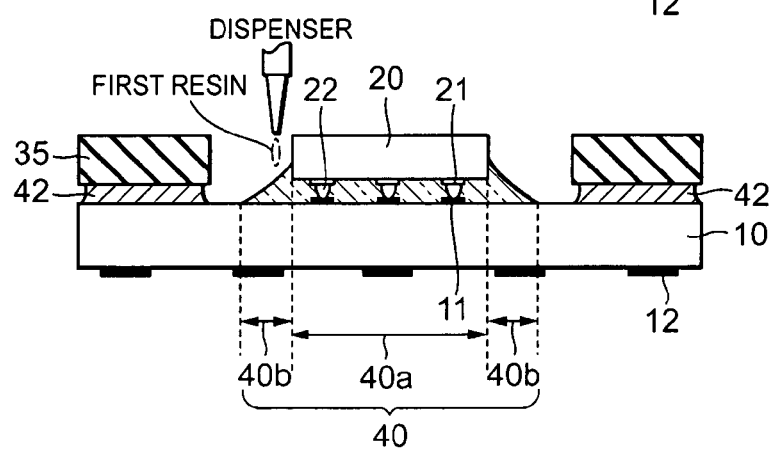
Figure 10E:
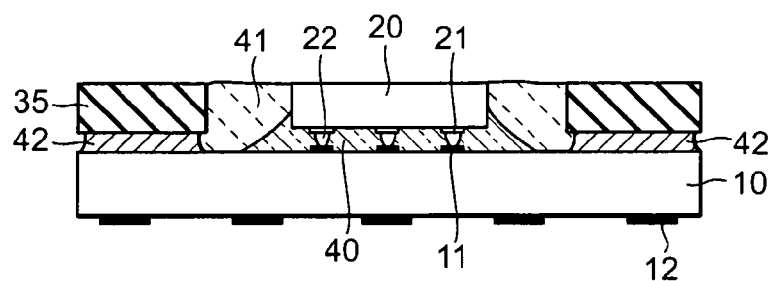
Figure 10F:
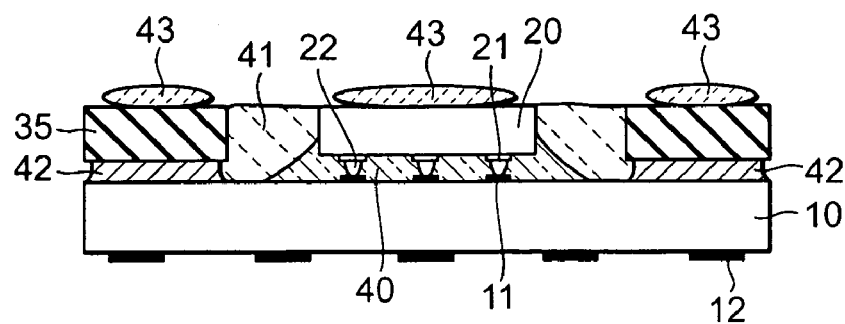
Figure 10G:
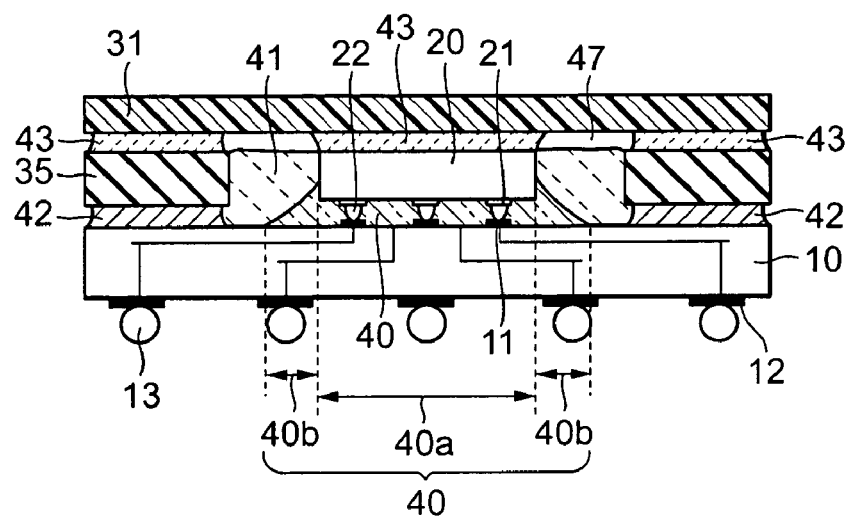
Figure 11F:
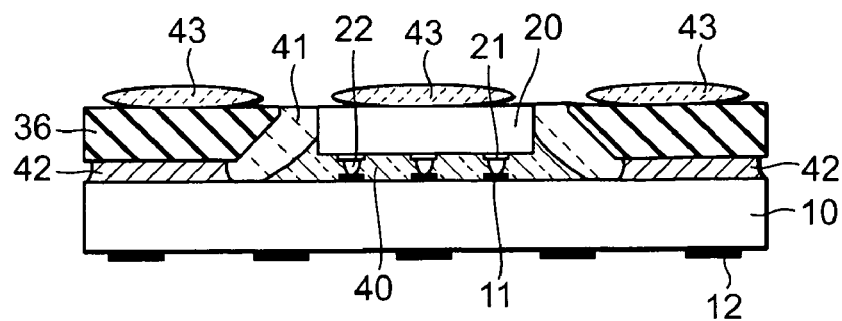
Figure 11G:
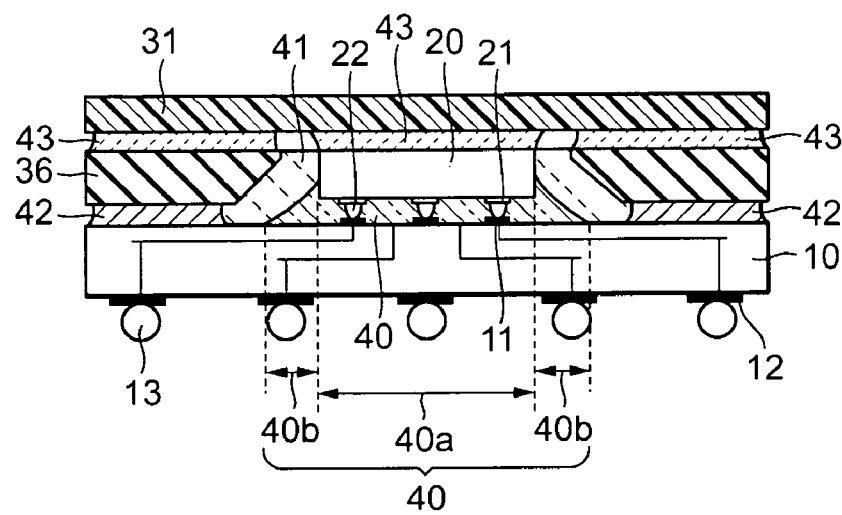

Next, a heating pressing-in nozzle 60 is brought into contact with two of the concave parts 34a formed in the corners of the stiffener 34 to which the lid 31 is connected, and the second resin 41 is injected to fill the space surrounded by the side faces of the chip 20, the inner walls of the stiffener 34, the lid 31, the substrate 10 and the fillet part 40b (FIGS. 9h and 9i). Note that, as the method for injecting the second resin 41 to fill the space, an injection method using a transfer mold can be also used.

Next, after the entire device is slowly heated to about 175° C., it is maintained at the state of about 175° C. for about 60 minutes, so that all of the first resin 40, the second resin 41, the first adhesive 42, and the second adhesive 43 are completely cured. Thereafter, for example, solder bumps 13, which become external terminals, are bonded to the external land electrodes 12 of the substrate 10 by a well known method, thus completing the semiconductor device 1d as shown in FIGS. 5a to 5c.

Sixth Embodiment

Figure 6:
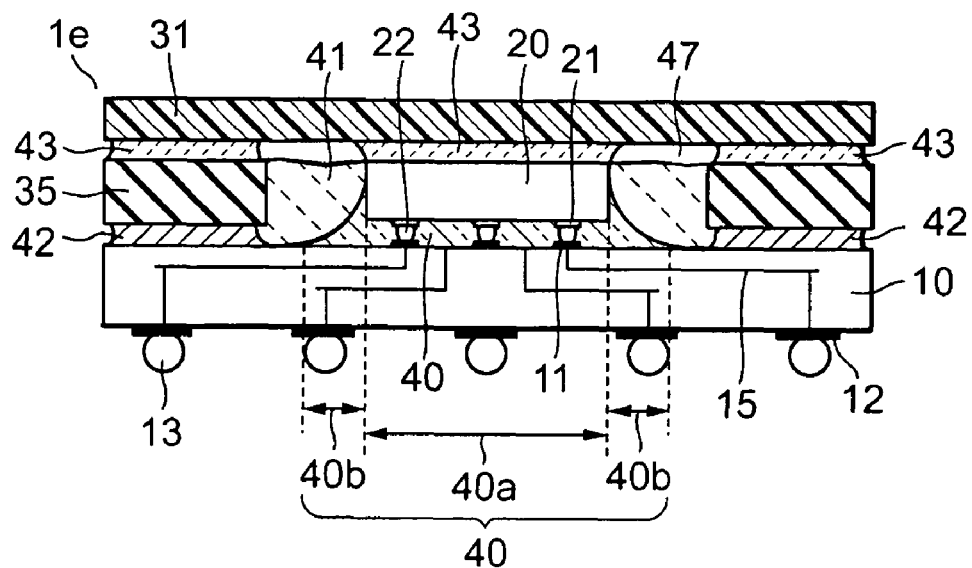
FIG. 6 is a sectional view of a semiconductor device of a sixth embodiment of the present invention, equivalent to FIG. 1b of the first embodiment.

Next, a sixth embodiment will be described with reference to FIG. 6. A semiconductor device 1e of this embodiment is different from the semiconductor device 1 of the first embodiment in that the stiffener 30 is replaced with a stiffener 35 made of an organic material resin. The other configuration is the same as that of the semiconductor device 1. Except for the fact that the stiffener 35 made of the resin is prepared beforehand by, e.g., transfer molding, the other steps of a method for manufacturing the semiconductor device 1e of this embodiment are similar to those of the method for manufacturing the semiconductor device 1 of the first embodiment, as shown in FIGS. 10a to 10g, and therefore detailed description thereof will be omitted. To explain an outline, first, the first adhesive 42 is applied on the substrate 10, and the resin stiffener 35 is mounted thereon to temporarily cure the first adhesive 42. Subsequently, the chip 20 is connected to the internal land electrodes 11 through flip chip bonding, and the gap between the chip 20 and the substrate 10 is filled with the first resin 40, which is then temporarily cured. Next, a second resin 41 is injected into the space between the stiffener 35 and the chip 20. Next, the second adhesive 43 is applied onto the backside of the semiconductor chip 20 and onto the second end surface of the stiffener 35, the lid 31 is mounted thereon to carry out full curing, and all of the first adhesive 42, the first resin 40, the second resin 41 and the second adhesive 43 are completely cured. Thus, the semiconductor device 1e is completed.

Note that, as another method for manufacturing the semiconductor device 1e of this embodiment, a method in which the substrate 10 is placed in a transfer sealing mold and the resin stiffener 35 is integrally formed on the substrate 10, can be applied. By this method, a shape shown in FIG. 10b can be realized, and the processes thereafter can be carried out similarly to the manufacturing method of the first embodiment. According to this method, it is possible to save labor in the manufacturing processes.

Seventh Embodiment

Figure 7:
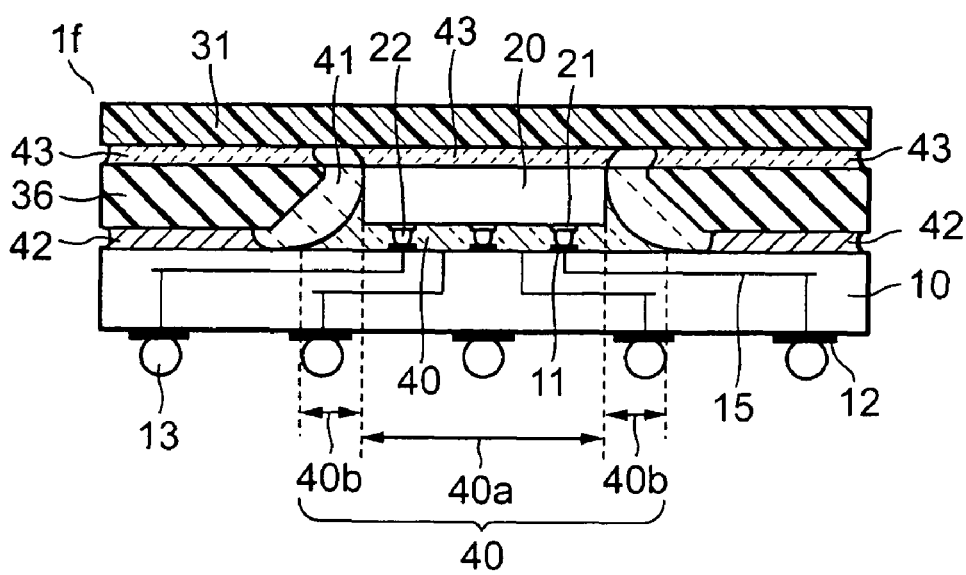
FIG. 7 is a sectional view of a semiconductor device of a seventh embodiment of the present invention, equivalent to FIG. 1b of the first embodiment.

Next, a seventh embodiment will be described with reference to FIG. 7. A semiconductor device 1f of this embodiment is different from the semiconductor device 1 of the first embodiment in that the stiffener 30 is replaced with a stiffener 36 which is made of an organic material resin and has a reverse-tapered opening. The other configuration is similar to that of the semiconductor device 1. According to the semiconductor device 1f of this embodiment, the stiffener 36 hangs over the second resin 41 in a manner of eaves. This structure provides an effect of suppressing the deformation of the fillet part 40b and of the second resin 41 toward a lid 31. A method for manufacturing the semiconductor device 1f of this embodiment is similar to that of the semiconductor device 1e of the sixth embodiment.

As described above, according to the present invention, a semiconductor chip is connected to a mounting substrate through flip chip bonding, a gap between the substrate and the chip is filled with a first resin, and a stiffener is attached to the substrate so as to surround the chip to serve as a lid support. In this state, the space surrounded by the mounting substrate, the side-walls of semiconductor chip, the stiffener and the lid is filled with the second resin smaller in thermal expansion coefficient than the first resin, and all the resins are cured. Accordingly, the second resin suppresses the up-and-down movements of the mounting substrate due to the expansion/contraction of the first resin, and thus it is possible to prevent the occurrence of detachment of the chip electrodes from the internal land electrodes and the occurrence of cracks of the solder bumps caused by temperature cycling. Moreover, since the strength of the mounting substrate can be reinforced at an initial stage of the manufacture, it is possible to improve handling performance and to suppress warpage in the mounting substrate during the manufacturing processes. Further, by temporarily curing the adhesives and the resins in the respective steps, and completely curing the adhesives and the resins all together at the end, it is possible to limit deformation to a minimum after the manufacture.

Figure 12A:
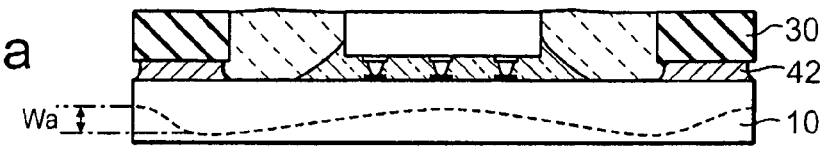
FIGS. 12a to 12e are views, each schematically showing a warped state of a mounting substrate in the semiconductor device of each embodiment of the present invention.
Figure 12B:
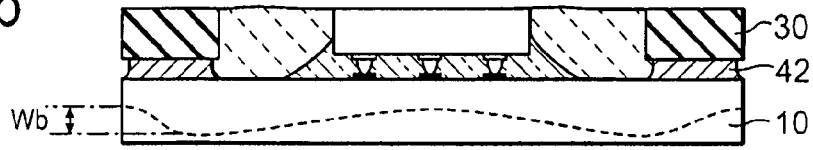
Figure 12C:
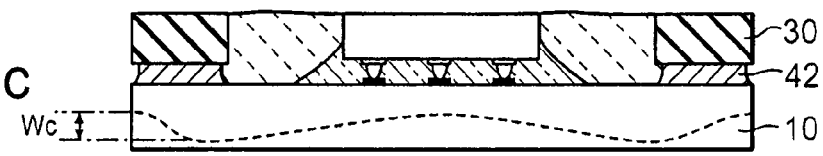
Figure 12D:
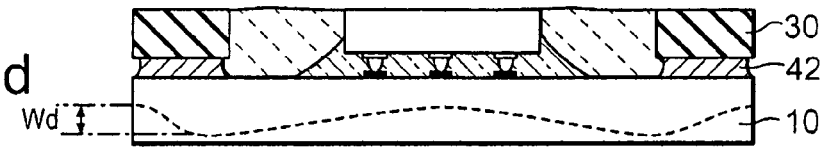
Figure 12E:
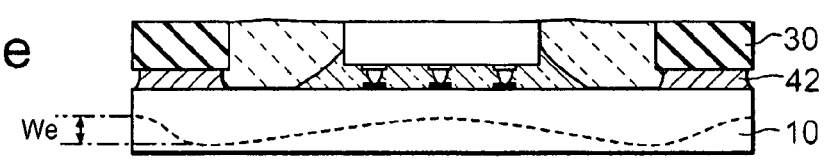
Figure 12F:
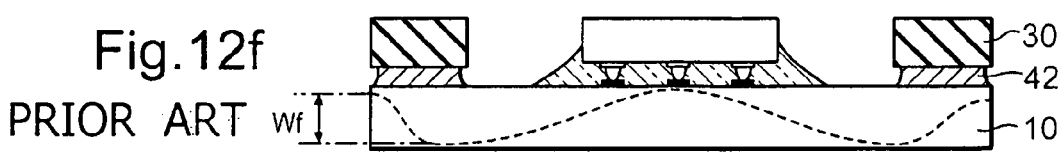
FIG. 12f is a view schematically showing a warped state of a mounting substrate of a conventional semiconductor device for comparison.

Specifically, for example, FIGS. 12a to 12e schematically show warped states of the mounting substrates in the respective semiconductor devices of the first to fifth embodiments of the present invention. Note that, for comparison, a warped state of a mounting substrate of a conventional semiconductor device is shown in FIG. 12f. In FIGS. 12a to 12f, broken lines schematically indicate the warped states of the mounting substrates. As can be understood from FIGS. 12a to 12e, maximum values Wa, Wb, Wc, Wd and We of the amounts of warpage in the mounting substrates of the semiconductor devices of the respective embodiments of the present invention are all sufficiently smaller than a maximum value Wf of the amount of warpage in the mounting substrate of the conventional semiconductor device.

Figure 13:
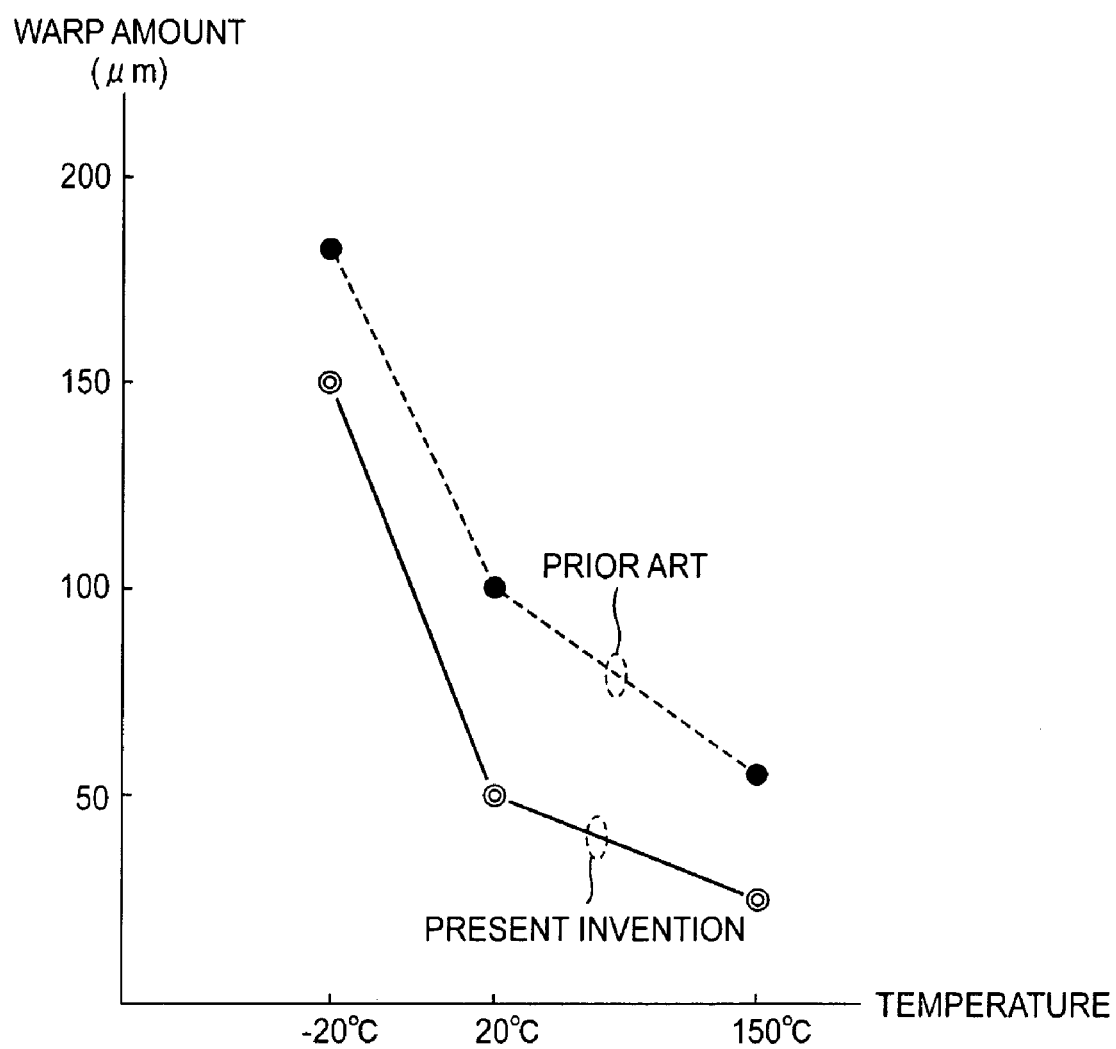
FIG. 13 is a graph showing results of actually measuring the amount of warpage in amounting substrate of a semiconductor device of the present invention when the temperature of the semiconductor device is changed.
Figure 14A:
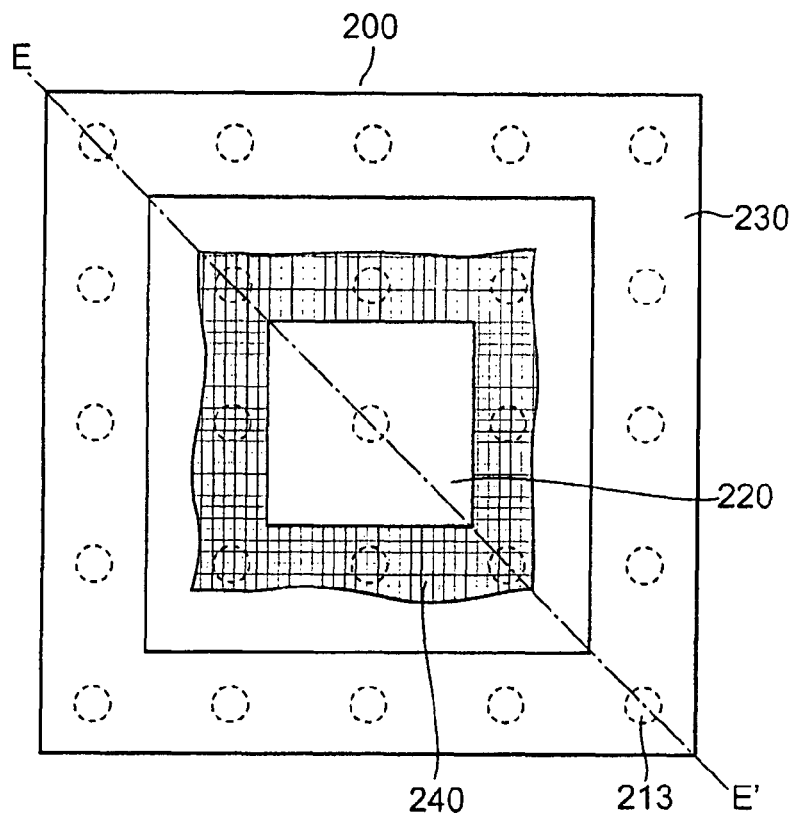
FIG. 14a is a plan view of a conventional semiconductor device in a state in which a lid is removed.
Figure 14B:
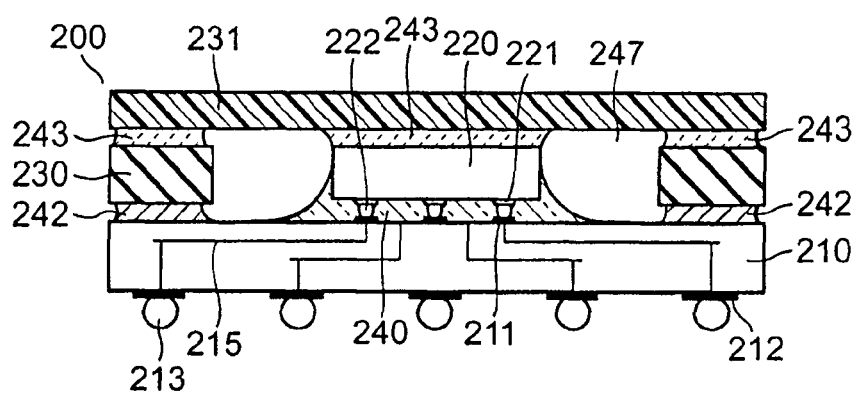
FIG. 14b is a sectional view taken along the line E-E' of FIG. 14a, in a state in which the lid is attached to the conventional semiconductor device.
Figure 15A:
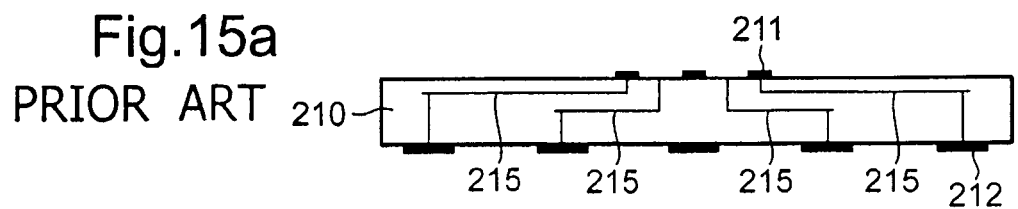
FIGS. 15a to 15g are sectional views for respective steps, taken along the line E-E' of FIG. 14a, for explaining a method for manufacturing the conventional semiconductor device.
Figure 15B:
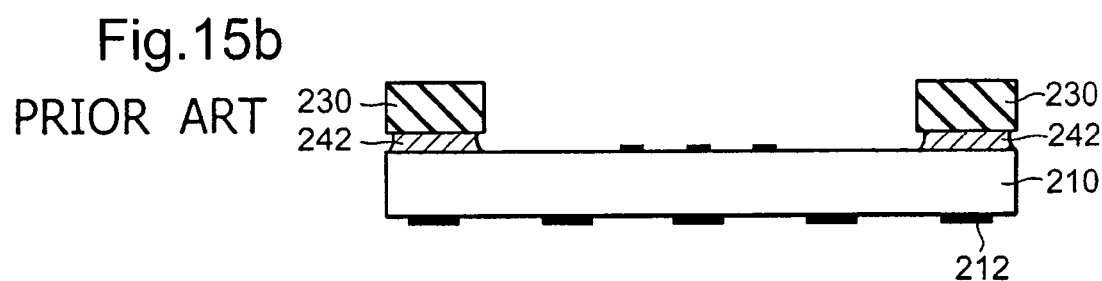
Figure 15C:
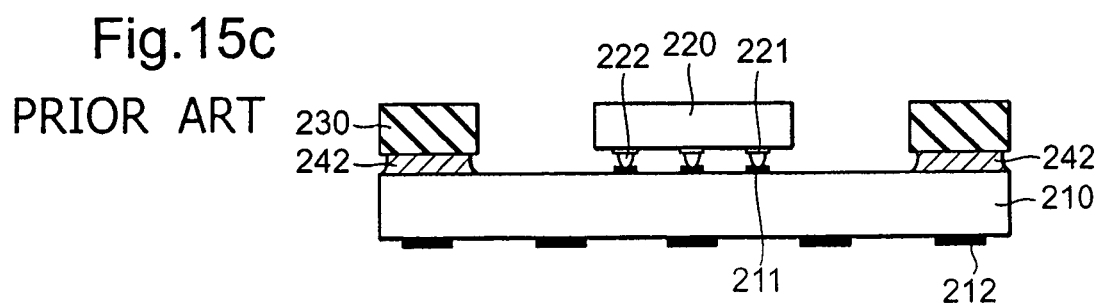
Figure 15D:
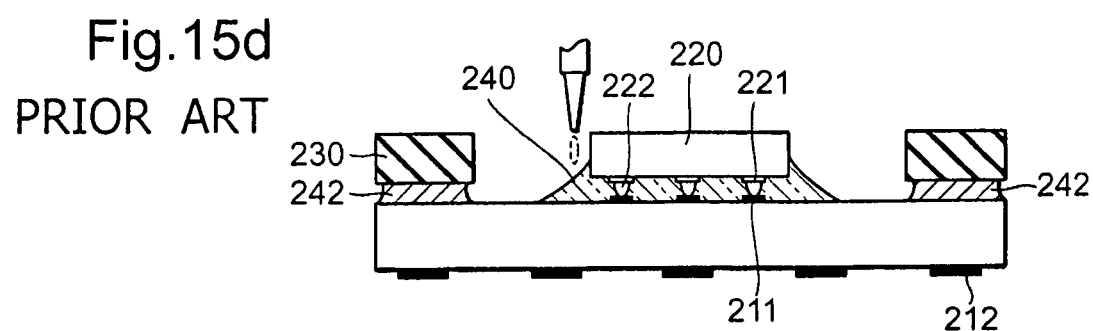
Figure 15E:
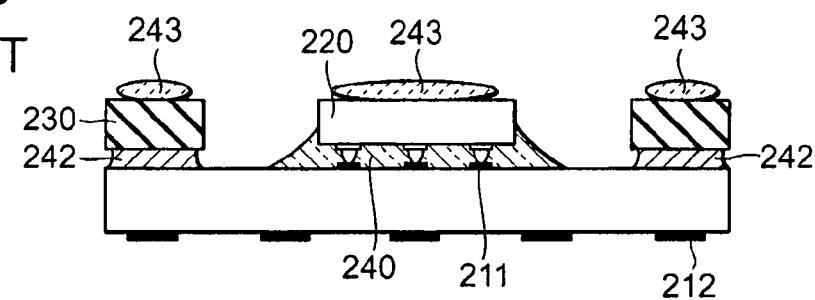
Figure 15F:
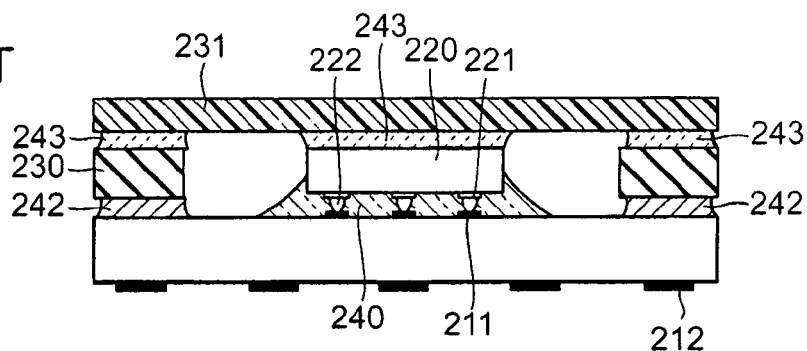
Figure 15G:
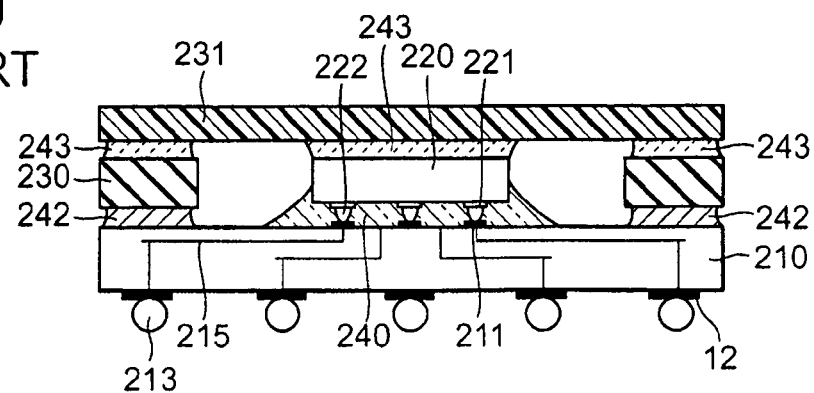
Figure 16A:
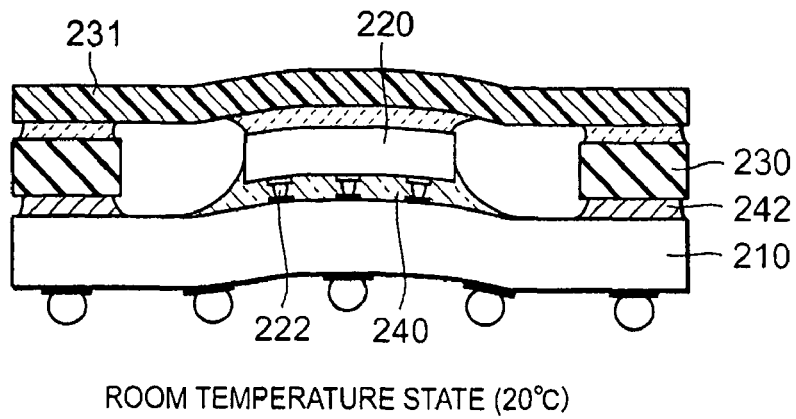
FIGS. 16a to 16c are views, each schematically showing a warped state of the conventional semiconductor device in a temperature cycling test.
Figure 16B:
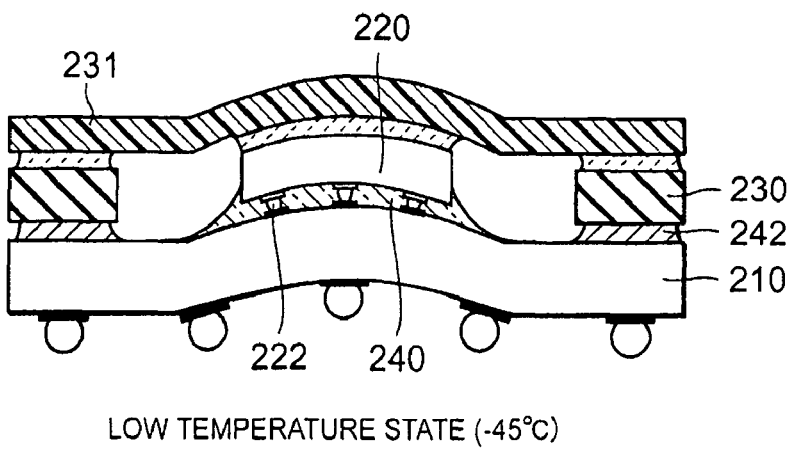
Figure 16C:
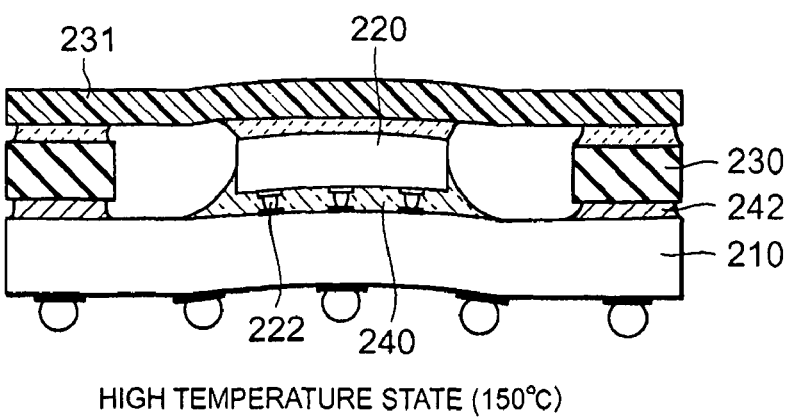
Figure 17:
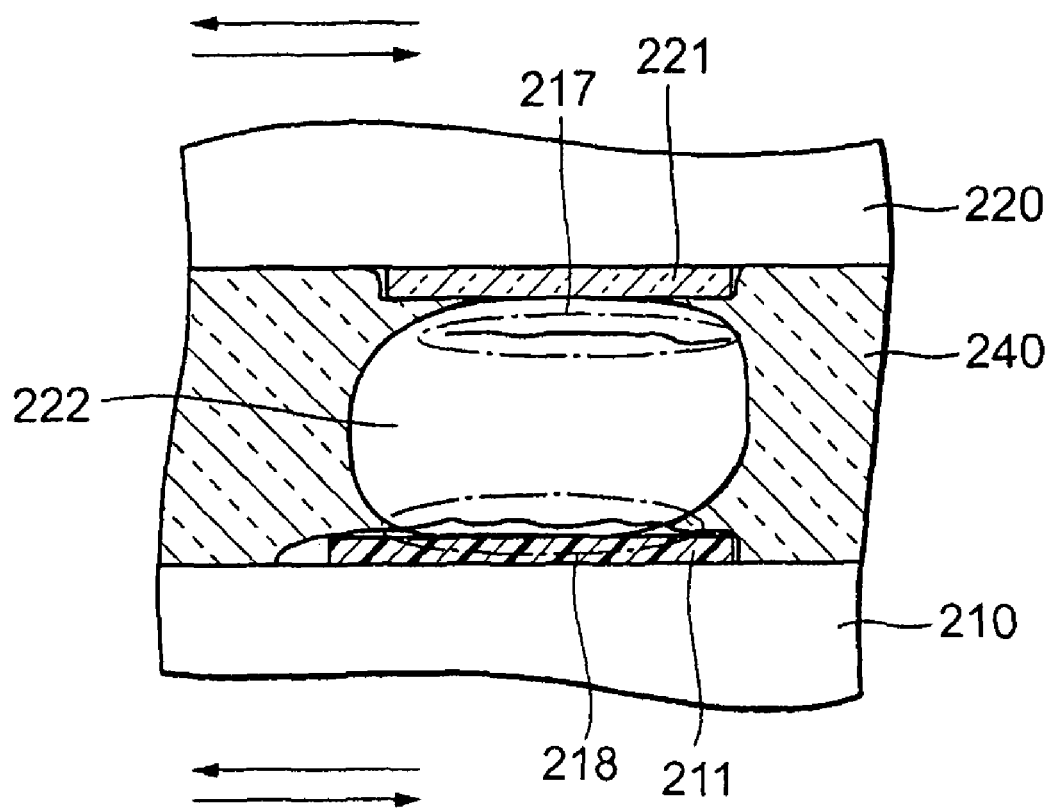
FIG. 17 is an enlarged sectional view around a bump electrode of the conventional semiconductor device.

FIG. 13 is a graph showing a result of actually measuring the amount of warpage in the mounting substrate of the semiconductor device when the temperature of a sample is changed, regarding the sample (semiconductor chip size: 17.3 mm×17.3 mm, mounting substrate thickness: about 1.0 mm, and mounting substrate size: 50 mm×50 mm) of the semiconductor device of the first embodiment of the present invention. Note that FIG. 13 also shows, as a comparative example, the amount of warpage in the mounting substrate of the semiconductor device of the conventional structure (the semiconductor chip size, the mounting substrate thickness and the mounting substrate size are the same as those of the above sample). It can be understood from FIG. 13 that the warpage in the mounting substrate of the semiconductor device of the present invention is much lower than that of the conventional semiconductor device, in the temperature cycling test.

Moreover, by using a resin the same as the second resin for the first adhesive as in the second embodiment, it is possible to further suppress the up-and-down movements of the mounting substrate due to the expansion/contraction of the first resin. Thus, it is possible to more effectively prevent the occurrence of detachment of the chip electrodes and of the internal land electrodes and the occurrence of cracks of the solder bumps caused by the temperature cycling.

Furthermore, as in the fifth embodiment, by filling the concave parts formed in four corners on the first end surface of the stiffener with the second resin smaller in thermal expansion coefficient than the first resin to use the second resin as part of the adhesive for bonding the stiffener to the mounting substrate, the influence of expansion/contraction in the diagonal direction of which the length is largest in the rectangular semiconductor device can be further suppressed. Thus, it is possible to more effectively prevent the occurrence of detachment of the chip electrodes and of the internal land electrodes and the occurrence of cracks of the solder bumps caused by the temperature cycling. Additionally, according to the second manufacturing method of the fifth embodiment, the second resin is injected and cured after the lid 31 is attached. Consequently, the space surrounded by the mounting substrate, the stiffener, the side walls of the semiconductor chip, the lid, and the fillet part can be completely filled with the second resin without generating any empty space 47 between the lid 31 and the second resin 41, and thus it is possible to suppress the deformation of the mounting substrate 10.

Note that, in each drawing illustrating a first, a second, a third, a fourth, a sixth and a seventh embodiments of the present invention, the empty space 47 is shown in exaggerated form for clarity. The empty space 47 is very small in practice, so the second resin 41 may be partially in contact with the lid 31 in each of the embodiments.

It is apparent that the present invention is not limited to the above embodiments and description, but may be modified or changed without departing form the scopes and spirits of apparatus claims that are indicated in the subsequent pages as well as methods that are indicated below:

AA. A first method for manufacturing a semiconductor device comprises the steps of: bonding a stiffener to a mounting substrate; connecting a semiconductor chip to the mounting substrate; filling a gap with a first resin and curing the first resin; filling a space surrounded by the stiffener, the mounting substrate, and the semiconductor chip with a second resin and curing the second resin; attaching a lid; and connecting solder bumps to the mounting substrate, wherein at least the step of bonding the stiffener to the mounting substrate is set as a first step, and the step of connecting the semiconductor chip to the mounting substrate is set as a second step.

BB. In the method described in AA, the step of bonding the stiffener to the mounting substrate includes the steps of: applying a first adhesive onto the mounting substrate; and semi-curing the first adhesive after the stiffener is mounted on the first adhesive, the step of filling the gap with the first resin and curing the first resin includes the steps of: filling the gap between the semiconductor chip and the mounting substrate with the first resin; and semi-curing the first resin, the step of filling the space with the second resin and curing the second resin includes the steps of: filling the space with the second resin; and semi-curing the second resin, and the step of attaching the lid includes the steps of: applying the second adhesive onto the backside of the semiconductor chip and onto the second end surface of the stiffener; mounting the lid on the second adhesive; and curing the second adhesive; wherein in the step of curing the second adhesive, the first adhesive, the second adhesive, the first resin and the second resin are completely cured all together.

CC. A second method for manufacturing a semiconductor device comprises the steps of: bonding a stiffener to a mounting substrate; connecting a semiconductor chip to the mounting substrate; filling a gap with a first resin and curing the first resin; filling a space surrounded by the stiffener, the mounting substrate, and the semiconductor chip with a second resin and curing the second resin; attaching a lid; and connecting solder bumps, wherein the step of filling the space with the second resin and curing the second resin is executed after the step of attaching the lid.

What is claimed is:

1. A semiconductor device comprising:
a semiconductor chip mounted on a mounting substrate;
a first resin filling a gap between the semiconductor chip and the mounting substrate;
a stiffener surrounding the semiconductor chip, the stiffener being adhered to the mounting substrate with a first adhesive; and
a second resin filling a space between the semiconductor chip and the stiffener in contact with the first resin, the second resin being smaller in a thermal expansion coefficient than the first resin,
wherein the first resin and the second resin comprise an epoxy resin main component and an inorganic filler component and wherein the epoxy resin main component is the same in the first resin and the second resin and the inorganic filler component of the first resin is different in content amount than the inorganic filler component of the second resin.

2. The semiconductor device as claimed in claim 1, wherein the first resin includes an underfill part filling the gap between the semiconductor chip and the mounting substrate, and a fillet part extended from a region of the semiconductor chip.

3. The semiconductor device as claimed in claim 1, wherein the first adhesive is larger in a thermal expansion coefficient than the second resin.

4. The semiconductor device as claimed in claim 2, wherein the second resin is in contact with inner walls of the stiffener, the fillet part, the mounting substrate and each of side faces of the semiconductor chip.

5. A semiconductor device comprising:
a semiconductor chip mounted on a mounting substrate;
a first resin filling a gap between the semiconductor chip and the mounting substrate;
a stiffener surrounding the semiconductor chip;
a second resin filling a space between the semiconductor chip and the stiffener in contact with the first resin, the second resin being smaller in a thermal expansion coefficient than the first resin; and
a lid for covering the stiffener and the semiconductor chip, wherein the lid is bonded to the stiffener and a backside of the semiconductor chip with a second adhesive,
wherein the first resin and the second resin comprise an epoxy resin main component and an inorganic filler component and wherein the epoxy resin main component is the same in the first resin and the second resin and the inorganic filler component of the first resin is different in content amount than the inorganic filler component of the second resin.

6. The semiconductor device as claimed in claim 5, wherein the second resin is in contact with an inner wall of the lid.

7. The semiconductor device as claimed in claim 1, wherein an elastic modulus of the second resin is larger than an elastic modulus of the first resin.

8. The semiconductor device as claimed in claim 1, wherein the stiffener has a plurality of concave portions facing the mounting substrate.

9. The semiconductor device as claimed in claim 8, wherein a planer shape of the stiffener is rectangular, and the concave portion is formed on each corner of the stiffener.

10. The semiconductor device as claimed in claim 8, wherein each of concave portions is filled with a resin the same as the second resin.

11. The semiconductor device as claimed in claim 1, wherein the stiffener end surface facing the mounting substrate is convexo-concave, and a gap between the mounting substrate and concave portion of the stiffener end surface is filled with a first adhesive.

12. The semiconductor device as claimed in claim 1, wherein the stiffener end surface facing the mounting substrate is convexo-concave, and a gap between the mounting substrate and concave portion of the stiffener end surface is filled with a resin the same as the second resin.

13. The semiconductor device as claimed in claim 1, wherein the stiffener end surface facing the mounting substrate is convexo-concave, the mounting substrate includes a first metal layer in a region facing the stiffener, the stiffener includes a second metal layer on a surface of a convex portion, and the mounting substrate and the convex portion of the stiffener are connected to each other by a low-melting alloy.

14. The semiconductor device as claimed in claim 1, wherein the stiffener is made of a material selected from the group consisting of Cu, SUS, Al, alumina, silicon, and aluminum nitride.

15. The semiconductor device as claimed in claim 1, wherein each of the first resin and the second resin essentially contains a resin selected from a group consisting of epoxy, polyolefin, silicon, cyanate ester, polyimide, polynorbornene resins.

16. The semiconductor device as claimed in claim 1, wherein a gap member different from the first adhesive is partially arranged between the mounting substrate and the stiffener.

17. The semiconductor device as claimed in claim 16, wherein the gap member is made of a low-melting alloy.

18. The semiconductor device as claimed in claim 1, wherein the semiconductor chip is mounted on the mounting substrate through flip chip bonding.

19. The semiconductor device as claimed in claim 1, wherein the inorganic filler component of the first resin is different in density than the inorganic filler component of the second resin.

20. The semiconductor device as claimed in claim 5, wherein the inorganic filler component of the first resin is different in density than the inorganic filler component of the second resin.

* * * * *